United States Patent
Hong et al.

(10) Patent No.: US 9,470,585 B2
(45) Date of Patent: Oct. 18, 2016

(54) CALIBRATED TEMPERATURE MEASUREMENT SYSTEM

(71) Applicant: Intel IP Corporation, Santa Clara, CA (US)

(72) Inventors: Merit Hong, Chandler, AZ (US); David Harnishfeger, Chandler, AZ (US); Kris Kaufman, Gilbert, AZ (US)

(73) Assignee: Intel IP Corporation, Santa Clara, CA (US)

( * ) Notice: Subject to any disclaimer, the term of this patent is extended or adjusted under 35 U.S.C. 154(b) by 626 days.

(21) Appl. No.: 13/904,743

(22) Filed: May 29, 2013

(65) Prior Publication Data

US 2014/0355651 A1 Dec. 4, 2014

(51) Int. Cl.
G01K 7/00 (2006.01)
G01K 15/00 (2006.01)
G01K 7/22 (2006.01)
G01K 7/16 (2006.01)
G01R 19/25 (2006.01)

(52) U.S. Cl.
CPC ............... *G01K 15/005* (2013.01); *G01K 7/16* (2013.01); *G01K 7/22* (2013.01); *G01R 19/2506* (2013.01)

(58) Field of Classification Search
CPC .................................. G01K 7/22; G01K 7/16
USPC .................. 374/170, 183, 172, 173
See application file for complete search history.

(56) References Cited

U.S. PATENT DOCUMENTS

| 3,652,921 A | 3/1972 | Nye |
| 5,453,682 A * | 9/1995 | Hinrichs ................ G01R 27/02 324/119 |
| 6,099,163 A | 8/2000 | Goodwin |
| 6,554,469 B1 | 4/2003 | Thomson et al. |
| 7,345,529 B2 | 3/2008 | Atrash et al. |
| 2004/0004994 A1 | 1/2004 | Wu et al. |

(Continued)

FOREIGN PATENT DOCUMENTS

| CN | 202329848 | 7/2012 |
| JP | 2010/243354 | 10/2010 |

OTHER PUBLICATIONS

Korean Office Action, Application No. 2014-0064623; 6 pages with translation, Jul. 16, 2015.

(Continued)

*Primary Examiner* — Mirellys Jagan
(74) *Attorney, Agent, or Firm* — Baker Botts L.L.P.

(57) ABSTRACT

In accordance with some embodiments of the present disclosure, a calibrated temperature measurement system comprises a resistor, a thermistor, a resistance-to-current converter configured to generate a current signal based on a resistance, and an analog-to-digital converter (ADC) configured to receive a first current signal based on the resistor, convert the first current signal into a first digital signal, receive a second current signal based on the thermistor, and convert the second current signal into a second digital signal. A memory may comprise resistor-characterization information. A calculation stage communicatively coupled to an ADC output may be configured to determine a first digital value based on the first digital signal, determine a second digital value based on the second digital signal, calculate a resistance ratio based on the first digital value and the second digital value, and determine a temperature output value based on the resistance ratio and the resistor-characterization information.

12 Claims, 12 Drawing Sheets

(56) References Cited

U.S. PATENT DOCUMENTS

| | | |
|---|---|---|
| 2007/0091979 A1 | 4/2007 | Chiu |
| 2011/0090938 A1* | 4/2011 | Akins .................. G01K 7/24 374/185 |
| 2012/0004880 A1 | 1/2012 | Hsu et al. |
| 2012/0226460 A1 | 9/2012 | Fiennes et al. |
| 2014/0354308 A1* | 12/2014 | Hong .................. G01K 7/22 324/713 |
| 2014/0355650 A1* | 12/2014 | Hong .................. G01K 7/16 374/170 |

OTHER PUBLICATIONS

Office Action received for Chinese Application No. 201410233808, with English translation, mailed Aug. 3, 2016; 22 pages, Aug. 3, 2016.

* cited by examiner

US 9,470,585 B2

CALIBRATED TEMPERATURE MEASUREMENT SYSTEM

TECHNICAL FIELD

The present disclosure relates generally to electrical circuits and, more particularly, to temperature-measurement and voltage-measurement circuits.

BACKGROUND

The temperature at which a circuit is operating is a key performance consideration in many applications. For example, the performance of various semiconductor devices may vary widely across hot and cold temperatures. Thus, semiconductor manufacturers often guarantee circuit performance only for a predetermined temperature range. Because temperature can be a key performance consideration, some applications actively measure and monitor temperature. Devices known as thermistors are known to have a resistances that vary over temperature. Accordingly, some applications measure the resistance of a thermistor in order to track the approximate temperature at which a circuit is operating.

SUMMARY

A calibrated temperature measurement system is disclosed. In accordance with some embodiments of the present disclosure, a calibrated temperature measurement system comprises a resistor, a thermistor, a resistance-to-current converter configured to generate a current signal based on a resistance, and an analog-to-digital converter (ADC) configured to receive a first current signal based on the resistor, convert the first current signal into a first digital signal, receive a second current signal based on the thermistor, and convert the second current signal into a second digital signal. The system may further comprise a memory comprising resistor-characterization information and a calculation stage communicatively coupled to an ADC output and configured to determine a first digital value based on the first digital signal, determine a second digital value based on the second digital signal, calculate a resistance ratio based on the first digital value and the second digital value, and determine a temperature output value based on the resistance ratio and the resistor-characterization information.

In accordance with another embodiment of the present disclosure, a calibrated temperature measurement system may comprise a resistor, a resistance-to-current converter configured to generate a current signal based on a resistance, and an analog-to-digital converter (ADC) configured to receive a first current signal, the first current signal based on the resistor, convert the first current signal into a first digital signal, receive a second current signal, and convert the second current signal into a second digital signal. The system may also comprise a memory comprising resistor-characterization information and a calculation stage communicatively coupled to an ADC output and configured to determine a first digital value based on the first digital signal, determine a second digital value based on the second digital signal, calculate a resistance ratio based on the first digital value and the second digital value, and determine a temperature output value based on the resistance ratio and the resistor-characterization information.

In accordance with another embodiment of the present disclosure, a method for characterizing a temperature measurement system comprises generating a first current signal based on a reference resistor, converting the first current signal into a first digital signal, determining a first digital value corresponding to a resistance of the reference resistor based on the first digital signal, generating a second current signal based on a test resistor, converting the second current signal into a second digital signal, determining a second digital value corresponding to a resistance of the test resistor based on the second digital signal, and storing reference-resistor characterization information in a memory.

In accordance with yet another embodiment of the present disclosure, a method for measuring temperature, comprises generating a first current signal based on a resistor, converting the first current signal into a first digital signal, determining a first digital value corresponding to a resistance of the resistor based on the first digital signal, generating a second current signal based on a thermistor, converting the second current signal into a second digital signal, determining a second digital value corresponding to a resistance of the thermistor based on the second digital signal, calculating a resistance ratio based on the first digital value and the second digital value, and determining a temperature output value based on the resistance ratio and a resistor-characterization ratio.

It is to be understood that both the foregoing general description and the following detailed description are exemplary and explanatory and are not restrictive of the invention, as claimed.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION

Figure 1A:
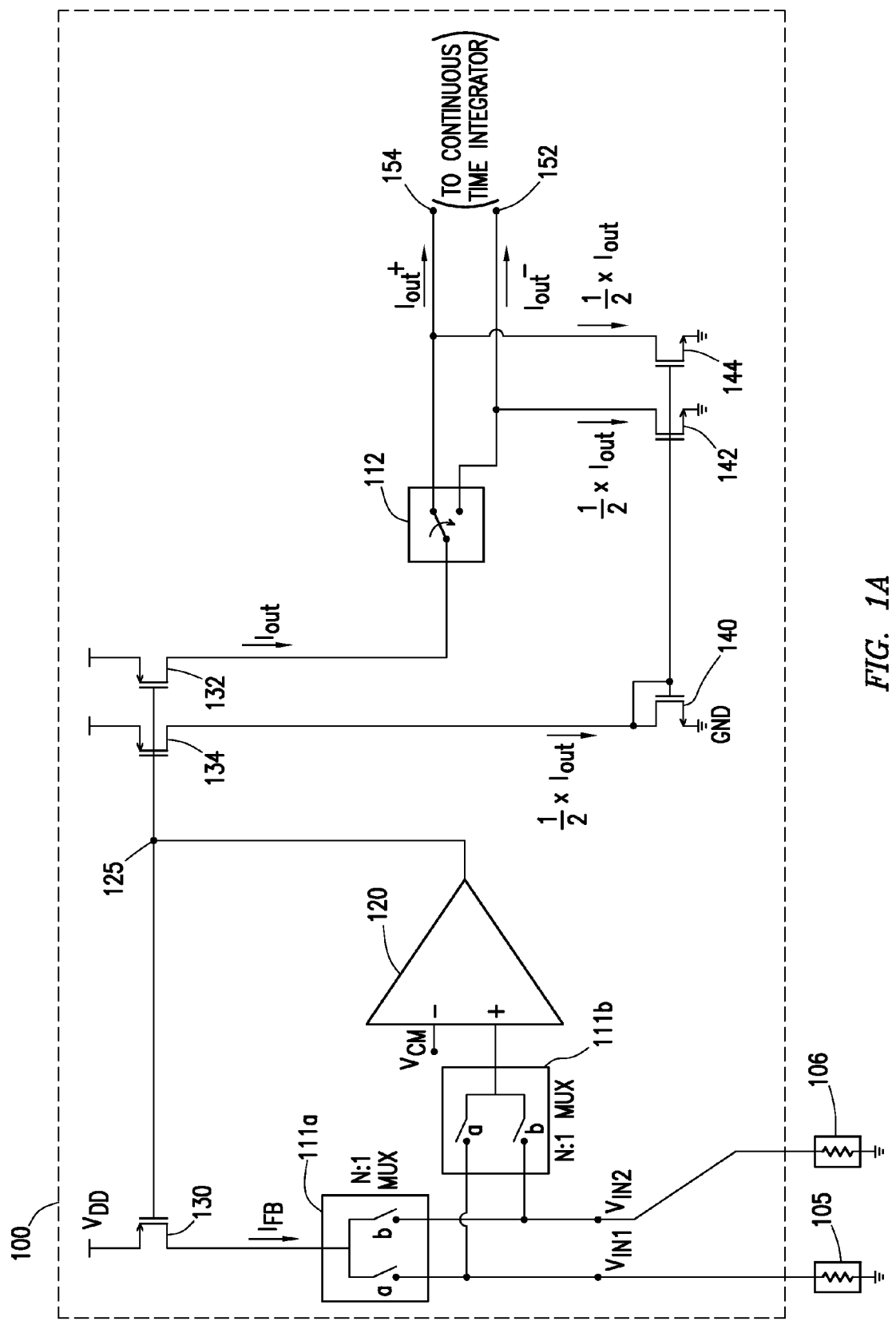
FIG. 1A illustrates a schematic diagram of a current-mode buffer, in accordance with the teachings of the present disclosure.

FIG. 1A illustrates a schematic diagram of a current-mode buffer 100, in accordance with the teachings of the present disclosure. Buffer 100 may be an input stage for a system that, as described in greater detail with reference to FIG. 3, may be configured to measure temperature by measuring the value of a temperature-dependant resistance.

Buffer 100 may include a common-mode voltage reference ($V_{CM}$), N:1 multiplexors (MUX) 111, an amplifier 120, p-type metal-oxide semiconductor field-effect transistors (PMOS) 130, 132, 134, n-type metal-oxide semiconductor field-effect transistors (NMOS) 140, 142, 144, as well as switch 112. Buffer 100 may be configured to sense a resistance coupled to one of multiple inputs of buffer 100 (e.g., $V_{IN1}$ and $V_{IN2}$), and to output a current based on the value of the resistance. The output current may be a differential output current, $I_{OUT}^+$ and $I_{OUT}^-$. In some embodiments, the output current may be inversely proportional to, or otherwise based on the sensed resistance. Buffer 100 may be configured to sense the resistance of any suitable device coupled to one of its inputs. For example, buffer 100 may be configured to sense the resistance of a thermistor, a resistor, a diode, a diode-connected transistor, or any other device with a resistive characteristic. Such resistive devices may be off-chip devices or on-chip devices located on the same semiconductor chip as buffer 100. For the purposes of the present disclosure, a thermistor may be any device whose resistance varies in a known manner with temperature. Accordingly, the current through a thermistor may vary across a range of temperatures when a given voltage is applied across the thermistor. Some commercially available thermistors may be case grounded, and thus may have one terminal coupled to ground (GND). Accordingly, some embodiments of buffer 100 may be configured to sense the resistance of a device coupled between an input of buffer 100 and GND.

As described above, buffer 100 may be configured to operate as an input stage for a temperature measurement system. In some embodiments, such a temperature measurement system may be configured to determine the temperature based on the measured resistance of thermistor 105. In some embodiments, such a temperature measurement system may be configured to determine the temperature based on a ratio including both the resistance of thermistor 105 and the resistance of reference resistor 106. Accordingly, buffer 100 may be configured to sense the resistance of different devices (e.g., thermistor 105 and reference resistor 106) at different times. For example, thermistor 105 may be coupled to $V_{IN1}$ and reference resistor 106 may be coupled to $V_{IN2}$. During a first period of time during which the resistance of thermistor 105 may be sensed and/or measured, MUX 111b may couple $V_{IN1}$ to an input of amplifier 120, and MUX 111a may couple a feedback path (e.g., a current path including PMOS 130) to $V_{IN1}$. Likewise, during a second period of time during which the resistance of reference resistor 106 may be sensed and/or measured, MUX 111b may couple $V_{IN2}$ to an input of amplifier 120, and MUX 111a may couple a feedback path (e.g., a current path including PMOS 130) to $V_{IN2}$.

Though MUX 111a and MUX 111b may be illustrated as 2:1 multiplexors, MUX 111a and MUX 111b may be "N:1" multiplexors with any suitable "N" number of inputs. Accordingly, MUX 111a and MUX 111b may accommodate any suitable number of inputs (e.g., three, four, or more) for any suitable number of resistive devices to be sensed and/or measured by buffer 100.

PMOS 130 and amplifier 120 may be configured to generate a current based on the resistance coupled to amplifier 120. As described above, when the positive input terminal of amplifier 120 is coupled by MUX 111b to $V_{IN1}$, the feedback path including PMOS 130 may also be coupled to $V_{IN1}$. At this time, amplifier 120 may compare the voltage at $V_{IN1}$ to a reference voltage (e.g., common-mode reference $V_{CM}$). The output of amplifier 120 may then drive PMOS 130 via feedback node 125 to generate a feedback current, $I_{FB}$. The feedback current may in turn create a voltage drop across thermistor 105 such that the voltage at $V_{IN1}$ is equivalent to the voltage of $V_{CM}$. Though the voltage at $V_{IN1}$ may be equivalent to the voltage of $V_{CM}$, there may be some offset due to an offset of amplifier 120 that may be the result of one or more non-idealities (e.g., semiconductor device mismatch, processing errors, and/or a limited voltage gain of amplifier 120). The feedback current $I_{FB}$ during the sensing and/or measurement of thermistor 105 may be represented by the following equation: $I_{FB}=V_{IN1}/R_{TH}$, where $R_{TH}$ may be the resistance of thermistor 105. Because the voltage at $V_{IN1}$ may be forced by amplifier 120 to be equivalent to $V_{CM}$, the feedback current $I_{FB}$ may also be expressed as $I_{FB}=V_{CM}/R_{TH}$. Buffer 100 may operate in a similar manner when the resistance of reference resistor 106 coupled to $V_{IN2}$ is sensed and/or measured. For such measurements, the feedback current $I_{FB}$ may be expressed as $I_{FB}=V_{CM}/R_{REF}$, where $R_{REF}$ may be the resistance of reference resistor 106.

MUX 111a and MUX 111b may include components, such as pass-gate transistors (not expressly shown), that may have a resistance. Accordingly, any current flowing through MUXs 111 may cause a voltage drop. Because the resistances of such devices internal to MUXs 111 may be affected by various parameters (e.g., semiconductor process variation and/or temperature) any voltage drop across MUX 111 may vary. To avoid errors caused by such varying voltage drops, the inputs of amplifier 120 may be configured to not draw any significant amount of current. Accordingly, buffer 100 may sense a resistance coupled to $V_{IN1}$ and/or $V_{IN2}$ without a significant amount of current flowing through MUX 111b. Thus, any voltage drop and/or error associated with such current through MUX 111b may be avoided. Because buffer 100 may be configured to sense the value of resistance coupled to $V_{IN1}$ and/or $V_{IN2}$ without drawing any current from $V_{IN1}$ and/or $V_{IN2}$ to the input of amplifier 120, buffer 100 may be referred to herein as a "high-impedance buffer."

As described above, the value of the feedback current, $I_{FB}$, may based on value of the resistance coupled to $V_{IN1}$ or $V_{IN2}$. Thus, a current that may be equivalent to $I_{FB}$, proportional to $I_{FB}$, or otherwise based on $I_{FB}$, may be utilized to measure the value of the resistance coupled to $V_{IN1}$ or $V_{IN2}$. In some embodiments, PMOS 132 may be configured to mirror PMOS 130, and thereby may provide a single-ended output current, $I_{OUT}$, that may be proportional to $I_{FB}$. Like PMOS 130, PMOS 132 may have a source coupled to VDD and a gate coupled to feedback node 125.

In order to scale $I_{OUT}$ to a desired level for a given $I_{FB}$, the size of PMOS 132 may be adjusted to any suitable size that may be larger or smaller than the size of PMOS 130. For the purposes of the present disclosure, the "size" of a PMOS or an NMOS transistor may refer to the width-to-length ratio of the transistor. In some embodiments, the size of PMOS 132 may be configured to be double the size of PMOS 130, and thus the value of $I_{OUT}$ may be double the value of $I_{FB}$.

Likewise, in some embodiments, the size of PMOS 132 may be configured to be half the size of PMOS 130, and thus the value of $I_{OUT}$ may be half the value of $I_{FB}$. For the purposes of the present invention, the ratio $I_{OUT}$ to $I_{FB}$ may be referred to as the "gain" of buffer 100.

In some embodiments, the gain of buffer 100 may be dynamically adjusted. For example, PMOS 132 may have an adjustable size. To implement an adjustable size, PMOS 132 may include any suitable number of individual PMOS devices that may be selectively included in the operation of PMOS 132. Each individually selected PMOS device may contribute to the overall size of PMOS 132. Accordingly, the selection of more individual PMOS devices may result in a larger effective size for PMOS 132, and the selection of less individual PMOS devices may result in a smaller effective size for PMOS 132. In some embodiments, the selection and de-selection of such individual devices may be implemented by the coupling of one or more of the gate, source, and/or drain terminals of each individual device to the respective gate, source, and/or drain terminals of PMOS 132 via a switch, pass-gate, or any other suitable device configured to selectively couple two terminals together.

Buffer 100 may be configured to output $I_{OUT}$ to either the positive output node 154 or the negative output node 152. For example, the output stage of buffer 100 may include switch 112. During a first polarity state, switch 112 may route the single-ended $I_{OUT}$ to positive output node 154, and during a second polarity state, switch 112 may route the single-ended $I_{OUT}$ to negative output node 152. The alternating polarities of the output of buffer 100 may be used by a system incorporating buffer 100 to correct for offsets and/or other signal errors caused by buffer 100 due to semiconductor device mismatch, semiconductor processing defects, or other types of non-idealities. For example, buffer 100 may incur an offset due to, for example, a positive offset at the input of amplifier 120 during a first measurement of thermistor 105. During the first measurement of thermistor 105, the single-ended $I_{OUT}$ may be routed to positive output terminal 154, and thus the offset may be output as positive offset. The polarity state of buffer 100 may then be alternated by alternating the state of switch 112. During a second measurement of thermistor 105, the single-ended $I_{OUT}$ may be routed to negative output terminal 152. A similar offset may be incurred during the second measurement. But because $I_{OUT}$ may be routed to negative output terminal 152, the offset may be output as a negative offset. For the purposes of the present disclosure, an output current based on a resistive device (e.g., thermistor 105) while buffer 100 is in a second polarity state may be referred to as being "complementary" of an output current based on that same resistive device while buffer 100 is in a first polarity state. As described in further detail below with reference to FIG. 3, a system receiving the two output currents representing the first and second measurements of thermistor 105 may combine the two measurements such that certain offsets generated during the first and second polarity states cancel out.

In some embodiments, buffer 100 may be configured to convert the single-ended $I_{OUT}$ into a differential output current, $I_{OUT}^+$ and $I_{OUT}^-$. In order to convert a singled-ended current signal such as $I_{OUT}$ into a differential current signal, buffer 100 may be configured to source $I_{OUT}$ to one of the two output nodes 152 and 154 while sinking one-half $I_{OUT}$ from both output nodes 152 and 154. Such source and sink currents may result in a positive current of approximately one-half $I_{OUT}$ at one of the two output nodes 152 and 154, and a negative current of approximately one-half $I_{OUT}$ at the other of the two output nodes 152 and 154. Accordingly, a differential output current, $I_{OUT}^+$ and $I_{OUT}^-$, may be provided at output nodes 152 and 154 with a differential value that may be approximately equivalent to the single-ended value of $I_{OUT}$.

In some embodiments, buffer 100 may include PMOS 134. Like PMOS 132, PMOS 134 may have a gate coupled to feedback node 125 and a source coupled to VDD. PMOS 134 may be configured to match PMOS 132, but with a size that may be approximately one-half of the size of PMOS 132. Accordingly, the current provided by PMOS 134 may be approximately one-half of $I_{OUT}$. NMOS 140, NMOS 142, and NMOS 144 may in turn be configured to mirror the one-half-$I_{OUT}$ current of PMOS 134. For example, NMOS 140 may have a source coupled to ground ("GND"), and a gate and a drain coupled to the drain of PMOS 134. As such, NMOS 140 may generate a gate bias and may sink the one-half-$I_{OUT}$ current provided by PMOS 134. NMOS 142 and NMOS 144 may each include a source coupled to GND and a gate coupled to the gate of NMOS 140. NMOS 142 and NMOS 144 may be configured to match each other and may have approximately the same size. Moreover, NMOS 142 and NMOS 144 may configured to match NMOS 140 and may have approximately the same size as NMOS 140. Accordingly, NMOS 142 and NMOS 144 may each be configured to sink a current that may be approximately equal to one-half $I_{OUT}$. Thus, NMOS 142 may sink a current of approximately one-half $I_{OUT}$ from output node 152, and NMOS 144 may sink a current of approximately one-half $I_{OUT}$ from output node 154. For the purposes of the present disclosure, NMOS 142 and NMOS 144 may be referred to either as a current sink or as a current source. Though the common mode of the output of buffer may be set by sourcing $I_{OUT}$ to one of the two output nodes 152 and 154 while also sinking one-half $I_{OUT}$ currents from both output nodes 152 and 154, the common mode of the output of buffer 100 may be established in any suitable manner. For example, $I_{OUT}$ could be sunk from one of the two output nodes 152 and 154, while one-half $I_{OUT}$ currents are sourced to both of the two output nodes 152 and 154.

Though the halving of $I_{OUT}$ is described above as a result of the PMOS 134 have one-half the size of PMOS 132, the halving of $I_{OUT}$ may be implemented in any suitable manner. For example, in some embodiments, PMOS 134 may have the same size as PMOS 132, and thus may provide a current equivalent to $I_{OUT}$ to NMOS 140. In such embodiments, NMOS 142 and NMOS 144 may be half the size of NMOS 140.

Figure 1B:
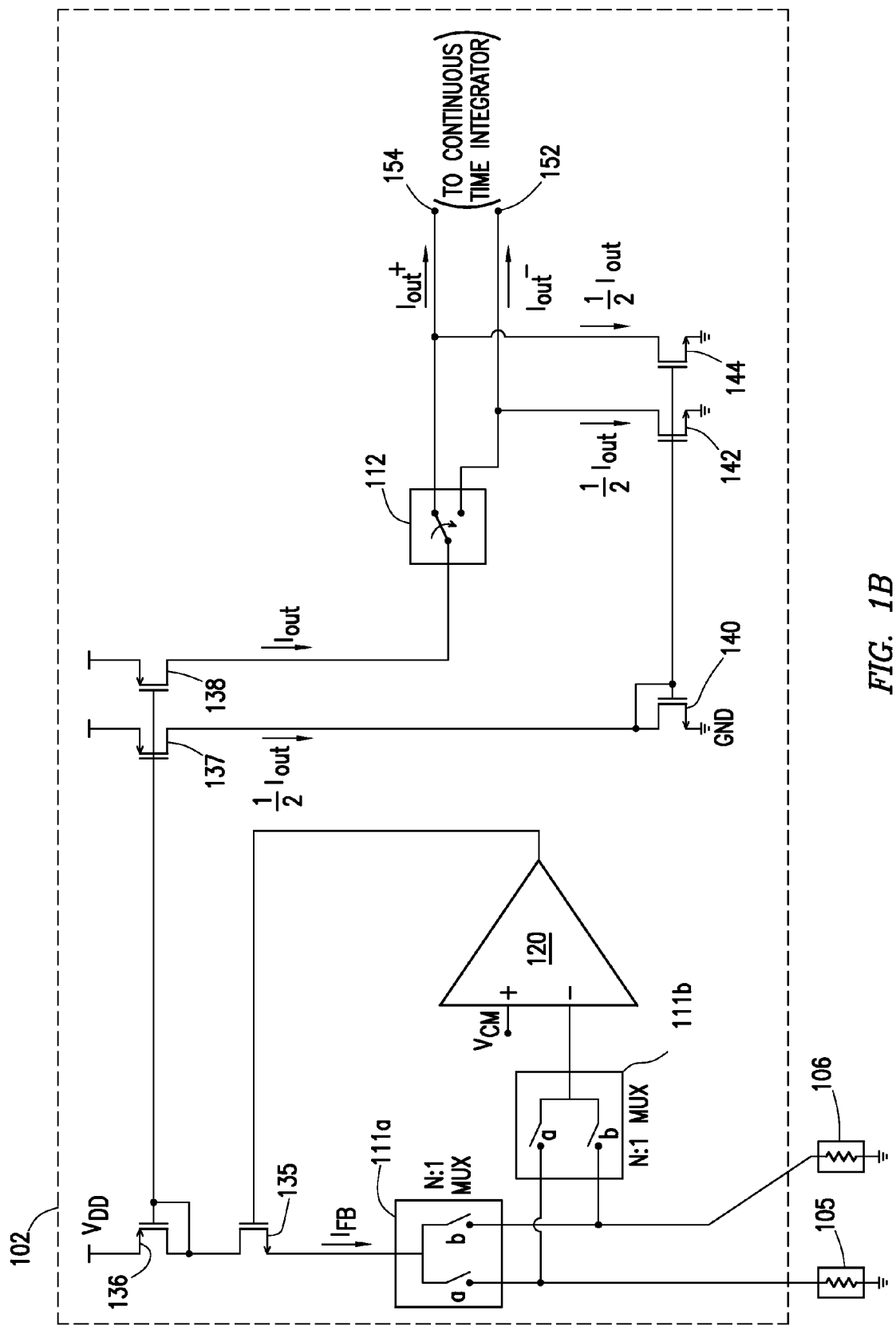
FIG. 1B illustrates a schematic diagram of a current-mode buffer, in accordance with the teachings of the present disclosure.

In some embodiments, $I_{OUT}$ may be mirrored from $I_{FB}$ without being directly driven by amplifier 120. FIG. 1B illustrates a schematic diagram of a current-mode buffer 102, in accordance with the teachings of the present disclosure. As illustrated in FIG. 1B, amplifier 120 may be configured to drive NMOS 135. NMOS 135 may have a gate coupled to the output of amplifier 120, a source coupled to MUX 111a, and a drain coupled to the gate and drain of a diode-connected device such as PMOS 136. PMOS 136 may have source coupled to VDD, and, as described above, a gate and a drain coupled to together and to the drain of NMOS 135. Because PMOS 136 may be in the same current path as the feedback transistor NMOS 135, the diode-connected PMOS 136 may self-bias with the feedback current $I_{FB}$. PMOS 138 and PMOS 137 may each have a gate coupled to the gate of PMOS 136, and accordingly may mirror PMOS 136. For example, PMOS 138 may mirror PMOS 136 to generate $I_{OUT}$ in a similar manner as PMOS 132 mirrors PMOS 130 in FIG. 1A. Likewise, PMOS 137 may mirror PMOS 136 to generate a one-half $I_{OUT}$ in a similar manner as PMOS 134 mirrors PMOS 130 in FIG. 1A.

As described above, the ability of buffer 100 to alternate polarities during two measurements of a device such as thermistor 105 may allow a system implementing buffer 100 to effectively cancel any offset incurred during the two measurements. Because the architecture of buffer 100 may allow for offsets to be canceled out at a later stage, buffer 100 may be designed with relaxed requirements for various parameters that may contribute to offset. For example, the dimensions of matched transistors in amplifier 120 (e.g., a differential pair and/or a current mirror) may affect how closely those matched transistors actually match. Typically, transistors with smaller dimensions (e.g., channel width and channel length for NMOS or PMOS devices) may be more susceptible to semiconductor processing defects or mismatch than transistors with larger dimensions. Such semiconductor processing defects or mismatch may affect, for example, a differential pair of transistors (not expressly shown) that may form the input to amplifier 120. The result of such mismatch may be an offset across the inputs of amplifier 120, which may in turn result in an offset in the output current. However, because any mismatch-induced offset may be cancelled out at a later stage, matched transistors within amplifier 120 may be implemented with nominal dimensions. Thus, a significant amount of semiconductor area may be saved as compared to matched transistors that are implemented with large dimensions in order to minimize mismatch and offset.

Figure 2:
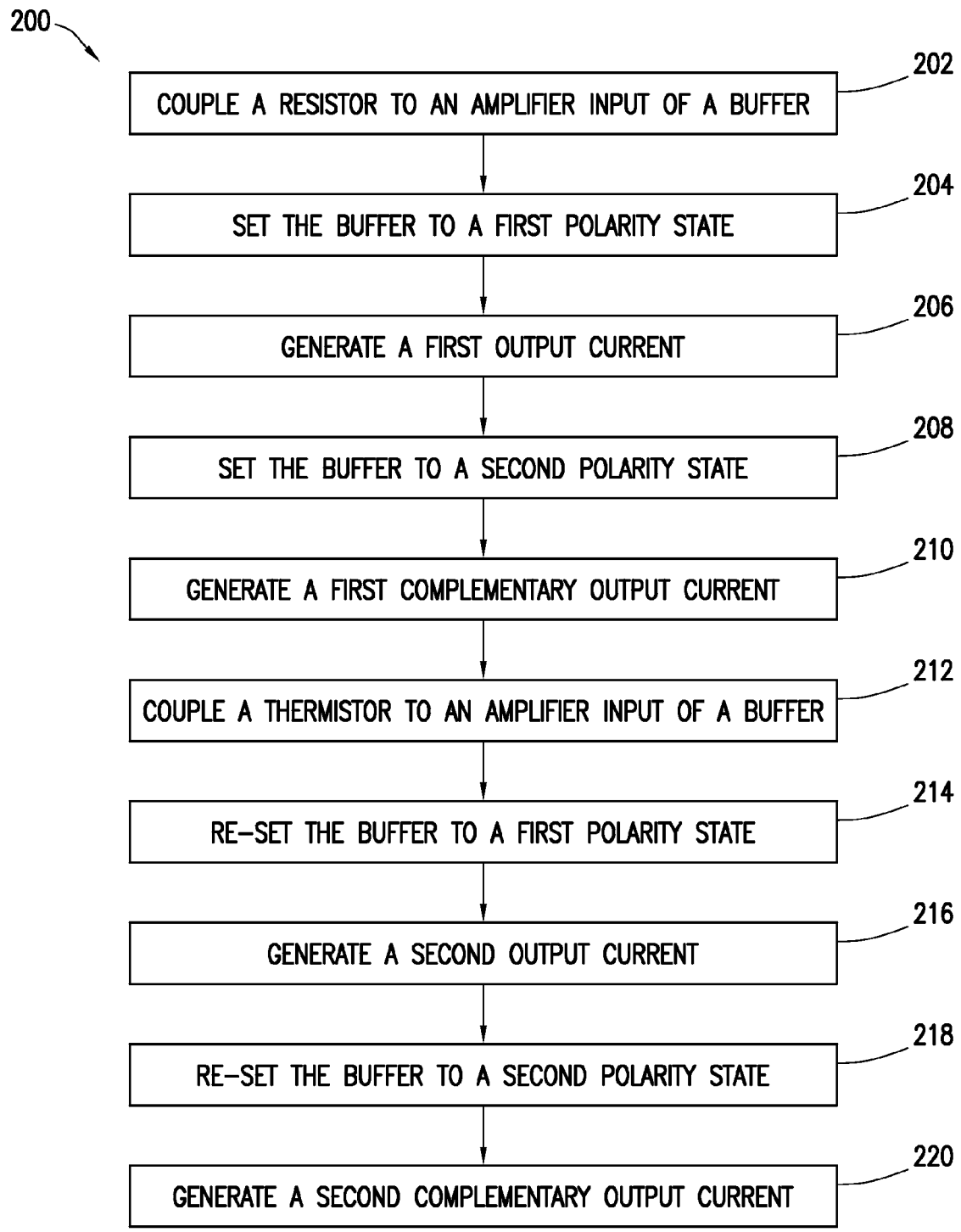
FIG. 2 depicts a flow chart of an example method for measuring the resistances of a resistor and a thermistor, in accordance with the teachings of the present disclosure.

FIG. 2 depicts a flow chart of an example method 200 for measuring the resistances of a resistor and a thermistor, in accordance with the teachings of the present disclosure.

At step 202, a resistor may be coupled to an amplifier input of a buffer. For example, reference resistor 106 may be selectively coupled by MUX 111*b* to the positive input of amplifier 120, and the feedback path may be coupled to reference resistor 106 by MUX 111*a*.

At step 204, the buffer may be set to a first polarity state. For example, switch 112 may be set to route the single-ended $I_{OUT}$ to the positive output node 154, while NMOS 144 and NMOS 142 each sink a current of one-half $I_{OUT}$ from positive output node 154 and negative output node 152 respectively.

At step 206, a first output current may be generated based on the resistor. For example, amplifier 120 may drive feedback node 125 to a voltage that causes a transistor in the feedback path (e.g., PMOS 130) to generate a feedback current that may be sufficient to force the voltage across reference resistor 106 to be equivalent to $V_{CM}$. In addition, PMOS 132 may mirror the feedback current of PMOS 130. In some embodiments, the single-ended signal current from PMOS 132 may be output as a single-ended output current. In some embodiments, the single-ended signal current from PMOS 132 may be converted into a differential output current by the one-half-$I_{OUT}$ current sinks formed by NMOS 142 and NMOS 144.

At step 208, the buffer may be set to a second polarity state. For example, switch 112 may be set to route the single-ended $I_{OUT}$ to the negative output node 152, while NMOS 144 and NMOS 142 each sink a current of one-half $I_{OUT}$ from positive output node 154 and negative output node 152 respectively.

At step 210, a first complementary output current may be generated based on a resistance of the resistor. Though the polarity of buffer 100 may be set to a second polarity state during step 210, a first complementary output current based on reference resistor 106 may be generated by buffer 100 in a manner similar to that of step 206.

At step 212, a thermistor may be coupled to an amplifier input of the buffer. For example, thermistor 105 may be selectively coupled by MUX 111*b* to the positive input of amplifier 120, and the feedback path may be coupled to thermistor 105 by MUX 111*a*.

During steps 214 through 220, multiple output currents based on a thermistor may be generated in a similar manner as the multiple output currents based on the resistor generated in steps 204 through 210.

At step 214, buffer 100 may be re-set to the first polarity state described in step 204.

At step 216, a second output current may be generated based on a resistance of the thermistor. For example, amplifier 120 may drive feedback node 125 to a voltage that causes a transistor in the feedback path (e.g., PMOS 130) to generate a feedback current that may be sufficient to force the voltage across thermistor 105 to be equivalent to $V_{CM}$. In addition, PMOS 132 may mirror the feedback current of PMOS 130. In some embodiments, the single-ended signal current from PMOS 132 may be output as a single-ended output current. In some embodiments, the single-ended signal current from PMOS 132 may be converted into a differential output current by the one-half-$I_{OUT}$ current sinks formed by NMOS 142 and NMOS 144.

At step 218, buffer 100 may be re-set to the second polarity state described in step 208. With buffer 100 in the second polarity state, a second complementary output current may be generated at step 220 based on a resistance of the thermistor. Though the polarity of buffer 100 may be set to a second polarity state during step 220, the second complementary output current may be generated by buffer 100 in an otherwise similar manner to that described above for step 216.

Although FIG. 2 discloses a particular number of steps to be taken with respect to method 200, method 200 may be executed with greater or lesser steps than those depicted in FIG. 2. For example, method 200 may be executed with only steps 202, 206, 212, and 216. In addition, although FIG. 2 discloses a certain order of steps to be taken with respect to method 200, the steps included in method 200 may be completed in any suitable order. For example, steps 212 through 220 may be performed prior to steps 202 through 210.

Figure 3:
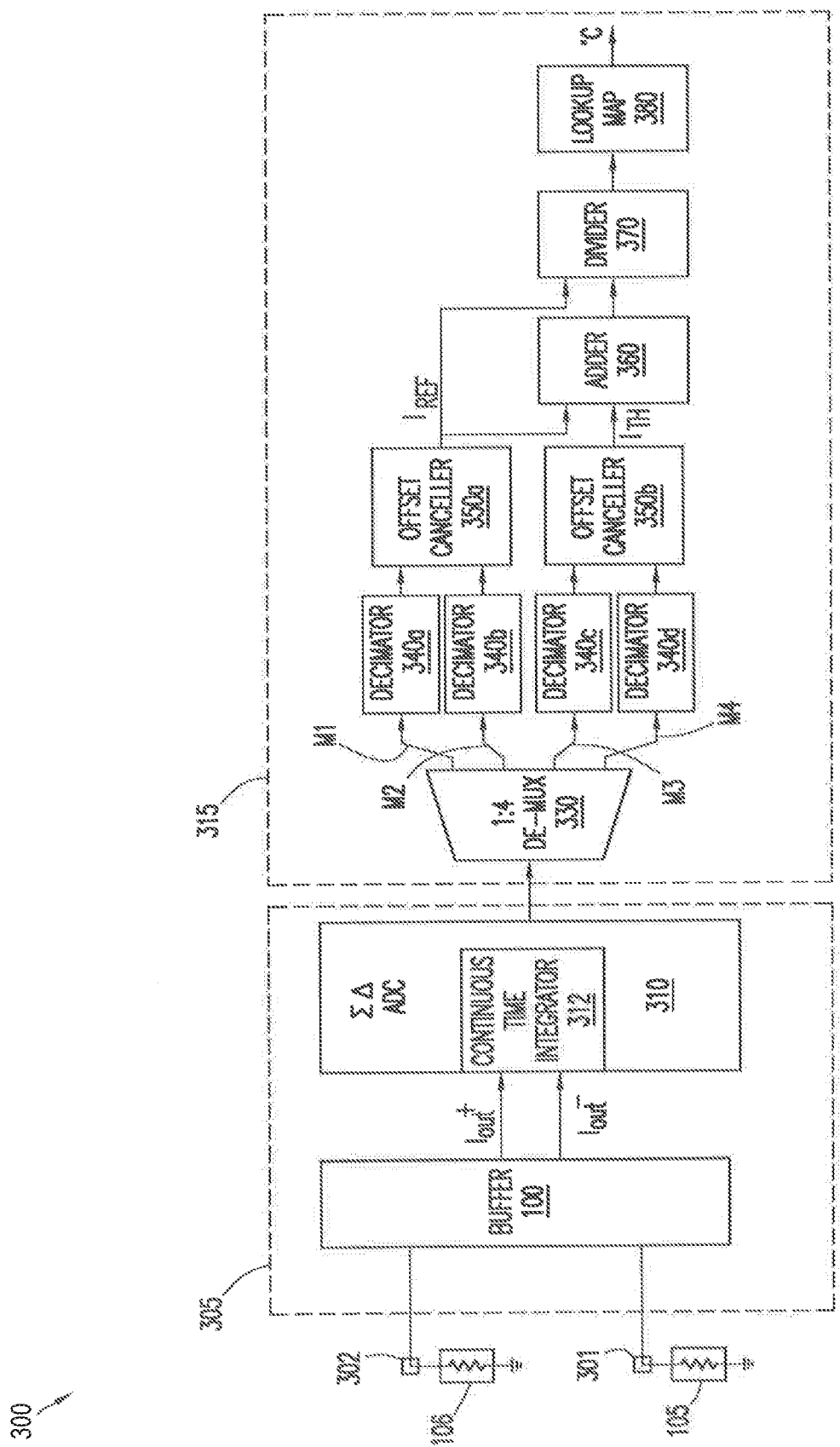
FIG. 3 illustrates a block diagram depicting a temperature measurement system, in accordance with the teachings of the present disclosure.

FIG. 3 illustrates a block diagram depicting a temperature measurement system 300, in accordance with the teachings of the present disclosure. Temperature measurement system 300 may include thermistor 105, reference resistor 106, an analog input stage 305, and a digital calculation stage 315. In some embodiments, analog input stage 305 and digital calculation stage 315 may be included on a single semiconductor chip, and thermistor 105 and reference resistor 106 may be external components. For such embodiments, thermistor 105 may be coupled to analog input stage 305 via pin 301, and reference resistor 106 may be coupled to analog input stage 305 via pin 302.

Analog input stage 305 may include buffer 100 and analog-to-digital converter (ADC) 310. As described above with reference to FIG. 1, buffer 100 may be configured to output a differential current signal that may be inversely proportional to, or otherwise based on, the value of a resistance coupled to buffer 100. Moreover, buffer 100 may be configured to alternate the polarity state of the output of buffer 100. For example, during a first measurement of reference resistor 106, buffer 100 may output a current to its positive output node 154 which may be coupled to a positive input of ADC 310. Likewise, during a second measurement of reference resistor 106, buffer 100 may output a current to its negative output node 152, which may be coupled to a negative input of ADC 310. In some embodiments, analog input stage 305 may include a resistance-to-current converter other than buffer 100. In such embodiments, analog input stage 305 may include an alternating-polarity device, which may alternate the routing of the output of the resistance-to-current converter to the positive input of ADC 310 and the negative input of ADC 310 in a similar manner as switch 112 alternates the output current of buffer 100. Moreover, in such embodiments, analog input stage 305 may include a common-mode circuit which may set and/or control the common mode of the current signal received by ADC 310.

ADC 310 may be implemented with any suitable type of ADC that may be configured to convert an analog current signal into a digital signal. For example, ADC 310 may be a sigma-delta ADC that may be configured to serially output a stream of digital bits that may represent the value the differential current signal, $I_{OUT}^+$ and $I_{OUT}^-$. Embodiments of ADC 310 that are implemented as a sigma-delta ADC, or any other suitable type of ADC, may include an suitable number of integration stages. In some embodiments, such integration stages may include a continuous-time integrator 312. The continuous-time operation of the one or more continuous-time integrators 312 may allow ADC 310 to operate in a low-noise manner. For example, continuous-time integrator 312 may generate significantly less noise than a switched-capacitor integrator. Such low-noise operation may allow ADC 310 to be located on the same semiconductor chip as noise-sensitive circuits (e.g., a wireless transceiver). Such integration may reduce part count and associated costs in various applications by allowing more circuits to be integrated on a single semiconductor chip.

Digital calculation stage 315 may include digital logic configured to receive and process one or more streams of digital bits from ADC 310 and to calculate a temperature. Digital calculation stage 315 may include a de-multiplexer (DEMUX) 330, one or more decimators 340, one or more offset cancellers 350, an adder 360, a divider 370, and a look-up map 380. Digital calculation stage 315 may include logic implemented in any suitable manner. For example, the logic of digital calculation stage 315 may be implemented in an application-specific integrated circuit (ASIC), in a field-programmable gate array (FPGA), in program instructions stored in a memory and configured to be executed by a multi-purpose processor, or any suitable combination thereof.

As described in further detail below, digital calculation stage 315 may be configured to: (i) convert the stream of bits from ADC 310 representing, at different times, the resistances of thermistor 105 and reference resistor 106 into multi-bit digital values (e.g., $I_{TH}$ and $I_{REF}$); (ii) calculate a resistance ratio based on the two digital values; and (iii) determine a temperature based on the calculated resistance ratio.

In some embodiments, the input of digital calculation stage 315 may be coupled to the input of DEMUX 330. In some embodiments, DEMUX 330 may be a one-to-four demultiplexer and may be configured to couple the input of digital calculation stage 315 to one of four decimators 340 at a time. Each of the four decimators 340a-d may be configured to receive the stream of digital bits from ADC 310 during one of four measurements (e.g., measurements M1 through M4). For example, DEMUX 330 may route measurement M1 to decimator 340a, measurement M2 to decimator 340b, measurement M3 to decimator 340c, and measurement M4 to decimator 340d. Measurements M1 and M2 may include complementary measurements of reference resistor 106. For example, measurement M1 may include the stream of bits from ADC 310 during a first period of time when buffer 100 senses the resistance of reference resistor 106 while in a first polarity state. In addition, measurement M2 may include the stream of bits from ADC 310 during a second period of time when buffer 100 senses the resistance of reference resistor 106 while in a second polarity state. Similarly, measurements M3 and M4 may include complementary measurements for thermistor 105. For example, measurement M3 may include the stream of bits from ADC 310 during a third period of time when buffer 100 senses the resistance of thermistor 105 while in a first polarity state. In addition, measurement M4 may include the stream of bits from ADC 310 during a fourth period of time when buffer 100 senses the resistance of thermistor 105 while in a second polarity state.

Each decimator 340 may be configured to convert a stream of digital bits from ADC 310 into a single multi-bit value. Decimator 340 may serially receive any suitable number of bits and may output a single multi-bit value. For example, decimator 340 may serially receive sixty-four consecutive bits from ADC 310 and may output a single multi-bit value corresponding to the number of the sixty-four input bits that were set to logical one. In some embodiments, upon receiving a logical one, decimator 340 may add one to its output value. Likewise, upon receiving a logical zero, decimator 340 may subtract one from its output value. Accordingly, for the sixty-four consecutive input bits, decimator 340 may have a minimum output value of negative sixty-four, and a maximum output value of positive sixty-four. Though the above example of decimator 340 refers to serially receiving sixty-four consecutive input bits, decimator 340 may be configured to receive any suitable number of bits in order to output a multi-bit value of suitable accuracy. The bit-size of decimator 340 may depend on multiple factors including, but not limited to, the desired resolution of the multi-bit output and the desired signal range. For example, decimator 340 may be configured to convert a large number of serially received bits in order to provide a large enough signal range that may avoid saturation when the gain of buffer 100 is dynamically increased or decreased, as described above with reference to FIG. 1. Moreover, decimator 340 may be any suitable number of order decimator. For example, decimator 340 may be a first-order decimator, a fourth-order decimator, or any other suitable number of order decimator.

Offset canceller 350a may be configured to receive the multi-bit values from decimators 340a and 340b representing measurements M1 and M2, and to output a multi-bit digital value, $I_{REF}$, which may represent the current of reference resistor 106 during the measurements of reference resistor 106. As described above, measurement M1 may have been performed on reference resistor 106 with buffer 100 set to a first polarity setting, and measurement M2 may have been performed on reference resistor 106 with buffer 100 set to a second polarity setting. Accordingly, offsets incurred during measurement M1 may correspond to equivalent offsets incurred during measurement M2. Such equivalent offsets may be cancelled out by any suitable technique. For example, as shown by the equations one through three, offset canceller 350a may subtract the value received from decimator 340b from the value received from decimator 340a in order to cancel offset current.

The current-mode measurement of reference resistor 106 with buffer 100 in a first polarity state may be represented as:

$$M1 = (V_{CM}'/R_{REF}) + I_{OFF} \qquad \text{(Eq. One)}$$

where $V_{CM}'$ is the common-mode reference voltage plus the offset of amplifier 120 in buffer 100, $R_{REF}$ is the resistance of reference resistor 106, and $I_{OFF}$ is the offset current incurred in or at the input of ADC 310 (e.g., input offset current of ADC 310 and/or output offset current of buffer 100 caused by mismatch of NMOS 142 and NMOS 144). Likewise the current-mode measurement of reference resistor 106 with buffer 100 in a second polarity state may be represented as:

$$M2 = -(V_{CM}'/R_{REF}) + I_{OFF}. \qquad \text{(Eq. Two)}$$

Subtracting M2 from M1 may accordingly result in the following:

$$I_{REF} = M1 - M2 = 2 * V_{CM}'/R_{REF}. \qquad \text{(Eq. Three)}$$

As shown below, the value of $I_{REF}$ may be further combined with the value of $I_{TH}$ to further cancel the offset of amplifier 120 represented in the value of $V_{CM}'$.

Offset canceller 350b may be configured to operate in a similar manner as offset canceller 350a. Offset canceller 350b may be configured to receive the multi-bit values from decimators 340c and 340d representing measurements M3 and M4, and to output a multi-bit digital value, $I_{TH}$, which may represent the current of thermistor 105 during the measurements of thermistor 105. As described above, measurement M3 may have been performed on thermistor 105 with buffer 100 set to a first polarity setting, and measurement M4 may have been performed on thermistor 105 with buffer 100 set to a second polarity setting. Accordingly, offset incurred during measurement M3 may correspond to an equivalent offset incurred during measurement M4. Such equivalent offsets may be cancelled out by any suitable technique. For example, as shown by the equations four through six, offset canceller 350b may subtract the value received from decimator 340d from the value received from decimator 340c in order to cancel offset current.

The current-mode measurement of thermistor 105 with buffer 100 in a first polarity state may represented as:

$$M3 = (V_{CM}'/R_{TH}) + I_{OFF} \qquad \text{(Eq. Four)}$$

where $V_{CM}'$ is the common-mode reference voltage plus the offset of amplifier 120 in buffer 100, $R_{TH}$ is the resistance of thermistor 105, and $I_{OFF}$ is the offset current of ADC 310. Likewise the current-mode measurement of thermistor 105 with buffer 100 in a second polarity state may be represented as:

$$M4 = (-V_{CM}'/R_{TH}) + I_{OFF}. \qquad \text{(Eq. Five)}$$

Subtracting M4 from M3 may accordingly result in the following:

$$I_{TH} = M3 - M4 = 2 * V_{CM}'/R_{TH}. \qquad \text{(Eq. Six)}$$

As shown below, the value of $I_{TH}$ may be further combined with the value of $I_{REF}$ to further cancel the offset of amplifier 120 represented in the value of $V_{CM}'$.

After $I_{TH}$ and $I_{REF}$ are determined, $I_{TH}$ and $I_{REF}$ may be combined in a ratio. As shown by equations eight and nine, such a current ratio may be equivalent to a resistance ratio including the respective resistances of reference resistor 106 and thermistor 105. For example, adder 360 may add $I_{TH}$ and $I_{REF}$. Divider 370 may then divide $I_{REF}$ by the output of adder 360 (i.e., the sum of $I_{TH}$ and $I_{REF}$). Substituting equation three and equation six for the values of $I_{REF}$ and $I_{TH}$ results in the following:

$$I_{REF}/(I_{REF}+I_{TH}) = (2*V_{CM}'/R_{REF})/((2*V_{CM}'/R_{REF}) + (2*V_{CM}'/R_{TH})). \qquad \text{(Eq. Seven)}$$

In such a ratio, the factor of two, and the value of $V_{CM}'$ (which includes the offset of amplifier 120 in buffer 100) may cancel out, resulting in the following:

$$I_{REF}/(I_{REF}+I_{TH}) = (1/R_{REF})/((1/R_{REF})+(1/R_{TH})). \qquad \text{(Eq. Eight)}$$

Multiplying the numerator and the denominator of equation eight by $R_{REF}*R_{TH}$ shows that the current ratio in equation eight may be equivalent to the following resistor ratio:

$$\Gamma = R_{TH}/(R_{TH}+R_{REF}) \qquad \text{(Eq. Nine)}$$

where $\Gamma$ represents the resistance ratio, $R_{REF}$ represents the resistance of reference resistor 106, and $R_{TH}$ represents the resistance of thermistor 105.

Reference resistor 106 may be a discrete off-chip component that may have approximately the same resistance value across a temperature range of, for example, eighty-five to negative thirty degrees Celsius. On the other hand, thermistor 105 may have a resistance that may vary by design across such a temperature range. Accordingly, the value of the resistance ratio may vary as a function of temperature across the temperature range. Look-up map 380 may be configured to receive the resistance ratio from divider 370 and to output a temperature value based on the resistance ratio. In some embodiments, look-up map 380 may include a non-volatile memory including table of potential resistance ratios and corresponding temperature values across a temperature range. For such embodiments, look-up map 380 may receive a resistance ratio from divider 370, determine the closest resistance-ratio entry in the table, and output the temperature that corresponds to the closest resistance-ratio entry in the table. The resolution of the temperature output for such embodiments may depend the number of potential resistance-ratio values in such a table of resistance-ratio values. For example, look-up map 380 may include a table with one-hundred and sixteen entries in order to provide a resolution of one-degree Celsius over a potential range of eighty-five degrees Celsius to negative thirty degrees Celsius.

In some embodiments, look-up map 380 may be configured to interpolate a temperature value based on two or more table entries. For example, if a resistance-ratio input is half way between the resistance ratios of two table entries, look-up map 380 may calculate a temperature that may be half way between the corresponding temperature output values for the two table entries. In some embodiments, look-up map 380 may include an algorithm instead of a table of resistance ratios and corresponding temperature values. For such embodiments, look-up map 380 may calculate a temperature output based on the resistance ratio and the temperature algorithm. The resistance-ratio and temperature values stored in a table in look-up map 380, and/or any parameters used in an algorithm of look-up map 380, may be based on known characteristics for thermistor 105 and/or reference resistor 106.

Temperature measurement system 300 may be configured to measure and output temperatures across any suitable temperature range for a given application. For example, in consumer electronic applications, temperature measurement system 300 may be configured to measure and output temperature values from eighty-five to negative thirty degrees Celsius. As another example, in automotive applications, temperature measurement system 300 may be configured to measure and output temperature values from one-hundred-and-forty to negative eighty-five degrees Celsius.

Because the final temperature measurement may be based on a ratio including $R_{TH}$ and $R_{REF}$, the accuracy of the final temperature measurement may depend on the relative value of $R_{TH}$ as compared to $R_{REF}$, rather than the accuracy of $R_{TH}$ or $R_{REF}$ individually. Various design parameters for ADC 310 and decimators 340 (e.g., the number of cycles of sigma-delta operation, the gain of ADC 310, and the order of decimation) may have the same impact on the respective accuracies of $R_{TH}$ and $R_{REF}$. Thus, while such design parameters may impact the measurement of $R_{TH}$ and/or $R_{REF}$ individually, those design parameters may have only a negligible impact on the resistance ratio including $R_{TH}$ and $R_{REF}$. As a result, temperature measurement system 300 may achieve a high degree of accuracy without tuning the gain of ADC 310 and/or performing a normalization on ADC 310 and decimators 340.

For similar reasons, temperature measurement system 300 may avoid errors caused by a gain error in buffer 100. For example, if semiconductor device mismatch causes the gain of buffer 100 to be five-percent larger than designed, the same five percent error may be incurred by each of measurements M1 and M2 for reference resistor 106, and each of measurements M3 and M4 for thermistor 105. In such situations, $R_{TH}$ and $R_{REF}$ may both include a five percent error. However, because the five percent error may effect $R_{TH}$ and $R_{REF}$ equally, such an error may cancel out of a resistance ratio including $R_{TH}$ and $R_{REF}$. Accordingly, the temperature measurement output may be unaffected by a gain error of buffer 100.

Because the architecture of temperature measurement system 300 may allow for potential gain errors in buffer 100 and/or ADC 310 to be canceled out, buffer 100 and/or ADC 310 may be designed with relaxed requirements for various parameters that may contribute to such gain errors. For example, as described above with reference to FIG. 1, the gain of buffer 100 may be affected by the size of PMOS 132 as compared to the size of PMOS 130. The ratio of the sizes of PMOS 130 and PMOS 132 may be affected, for example, by various semiconductor processing defects or mismatch. Transistors with smaller dimensions (e.g., channel width and channel length for NMOS or PMOS devices) may be more susceptible to semiconductor processing defects and/or mismatch than transistors with larger dimensions. However, because any mismatch-induced gain error may be cancelled out at a later stage, PMOS 130 and PMOS 132 may be configured with nominal dimensions. Thus, a significant amount of semiconductor area may be saved.

Though the resistance ratio may be described above as $\Gamma=R_{TH}/(R_{TH}+R_{REF})$, digital calculation stage 315 may be configured to implement any suitable ratio including $R_{TH}$ and $R_{REF}$. For example, DEMUX 330 may be configured to route measurements M1 and M2 to decimators 340c and 340d respectively, and to route measurements M3 and M4 to decimators 340a and 340b respectively. In such embodiments, adder 360 and divider 370 may combine to calculate a resistance ratio of $R_{REF}/(R_{REF}+R_{TH})$ rather than $R_{TH}/(R_{TH}+R_{REF})$. In some embodiments, the functionality of adder 360 may be bypassed, and a ratio of $R_{REF}/R_{TH}$ or $R_{TH}/R_{REF}$ may be utilized.

Figure 4:
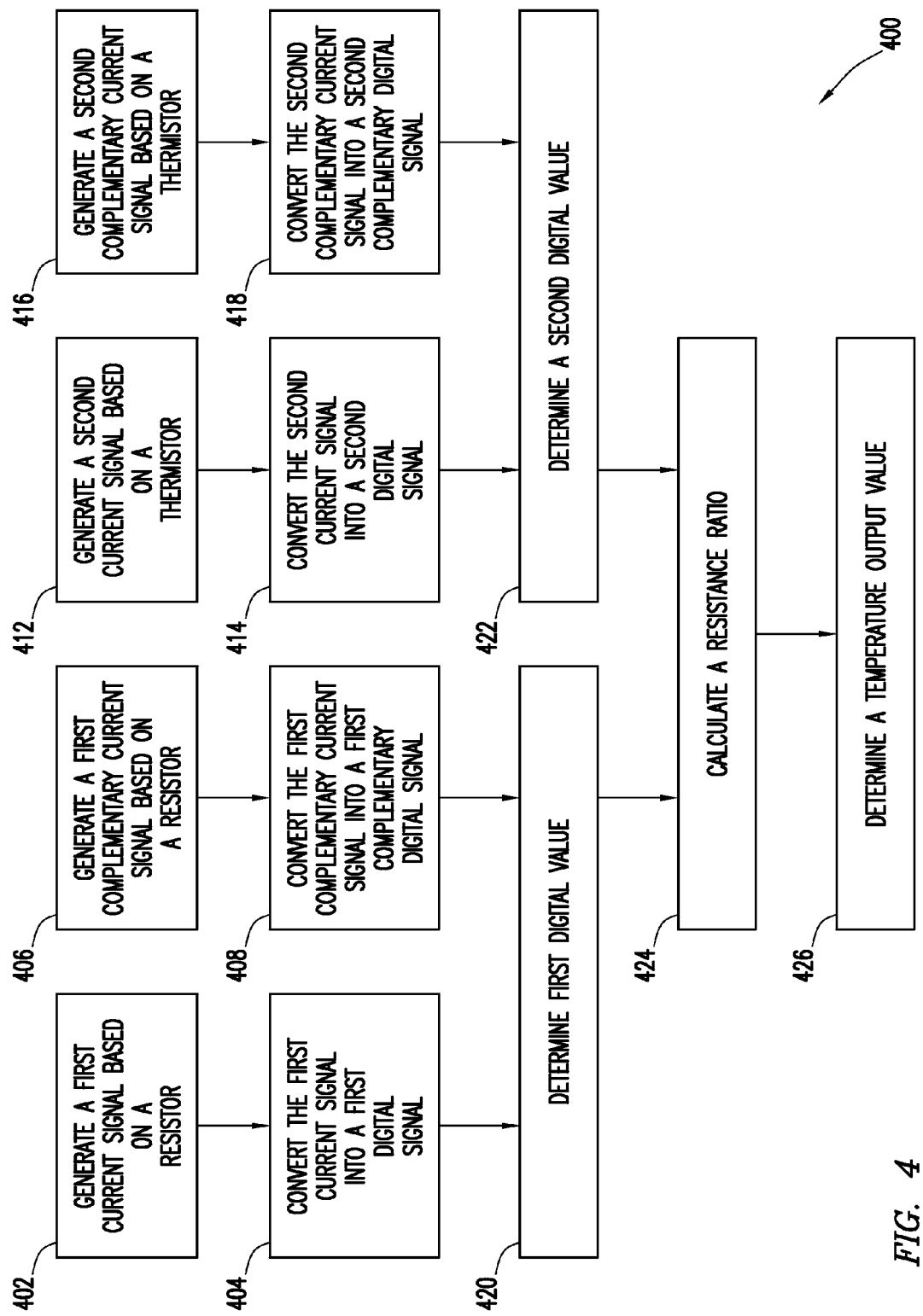
FIG. 4 depicts a flow chart of an example method for measuring temperature, in accordance with the teachings of the present disclosure.

FIG. 4 depicts a flow chart of an example method 400 for measuring temperature, in accordance with the teachings of the present disclosure. At step 402, a first current signal based on a resistance of a resistor may be generated. For example, buffer 100 may generate a differential output current that may be based on reference resistor 106. In some embodiments, buffer 100 may be set to a first polarity state during step 402. At step 404, the first current signal may be converted into a first digital signal. For example, ADC 310 may be a sigma-delta ADC, and may convert the differential output current from buffer 100 into a stream of digital bits.

At step 406, a first complementary current signal based on the resistance of the resistor may be generated. For example, the polarity of buffer 100 may be changed from a first polarity state to a second polarity state, and buffer 100 may generate a differential output current that may be based on reference resistor 106. Accordingly, offset current (e.g., $I_{OFF}$) incurred during step 402 may be matched by an equivalent offset during step 406. At step 408, the first complementary current signal may be converted into a first complementary digital signal. For example, ADC 310 may be a sigma-delta ADC, and may convert the differential output current from buffer 100 into a stream of digital bits.

At step 412, a second current signal based on a resistance of a thermistor may be generated. For example, buffer 100 may generate a differential output current that may be based on thermistor 105. In some embodiments, buffer 100 may be in a first polarity state during step 412. At step 414, the second current signal may be converted into a second digital signal. For example, ADC 310 may be a sigma-delta ADC, and may convert the differential output current from buffer 100 into a stream of digital bits.

At step 416, a second complementary current signal based on the resistance of the thermistor may be generated. For example, the polarity of buffer 100 may be changed from a first polarity state to a second polarity state, and buffer 100 may generate a differential output current that may be based on thermistor 105. Accordingly, offset current (e.g., $I_{OFF}$) incurred during step 412 may be matched by an equivalent offset during step 416. At step 418, the second complementary current signal may be converted into a second complementary digital signal. For example, ADC 310 may be a sigma-delta ADC, and may convert the differential output current from buffer 100 into a stream of digital bits.

At step 420, a first digital value corresponding to the resistance of the resistor may be determined. In some embodiments, the first digital value may be based on the first digital signal and the first complementary digital signal. For example, DEMUX 330 may route the first digital signal (e.g., the stream of bits generated by ADC 310 during step 404) to decimator 340a. Similarly, DEMUX 330 may route the first complementary digital signal (e.g., the stream of bits generated by ADC 310 during step 408) to decimator 340b. Decimators 340a and 340b may convert their respectively received digital signals into multi-bit values, and may send those multi-bit values to offset canceller 350a. Offset canceller 350a may subtract the output of decimator 340b from the output of decimator 340a and output a digital value, $I_{REF}$, which may depend on the resistance of reference resistor 106.

At step 422, a second digital value corresponding to the resistance of the thermistor may be determined. In some embodiments, the second digital value may be based on the second digital signal and the second complementary digital signal. For example, DEMUX 330 may route the second digital signal (e.g., the stream of bits generated by ADC 310 during step 414) to decimator 340c. Similarly, DEMUX 330 may route the second complementary digital signal (e.g., the stream of bits generated by ADC 310 during step 418) to decimator 340d. Decimators 340c and 340d may convert their respectively received digital signals into multi-bit values, and may send those multi-bit values to offset canceller 350b. Offset canceller 350b may subtract the output of decimator 340d from the output of decimator 340c and output a digital value, $I_{TH}$, which may depend on the resistance of thermistor 105.

At step 424, a resistance ratio may be calculated based on the first digital value and the second digital value. For example, adder 360 and divider 370 may combine to divide the first digital value (e.g., $I_{REF}$) by the sum of the first digital value (e.g., $I_{REF}$) and the second digital value (e.g., $I_{TH}$). As shown in equations eight and nine above, a ratio such as $I_{REF}/(I_{REF}+I_{TH})$ may be equivalent to a resistance ratio such as $R_{TH}/(R_{TH}+R_{REF})$.

At step 426, a temperature output value may be determined based on the resistance ratio. For example, look-up map 380 may contain a table of potential resistance ratios and corresponding temperature output values. The resistance ratio from step 424 may used to look up the closest resistance-ratio entry in the table, and the corresponding temperature output value may be returned.

Although FIG. 4 discloses a particular number of steps to be taken with respect to method 400, method 400 may be executed with greater or lesser steps than those depicted in FIG. 4. For example, method 400 may be executed without steps 406, 408, 416, and 418. In addition, although FIG. 4 discloses a certain order of steps to be taken with respect to method 400, the steps included in method 400 may be completed in any suitable order. For example, step 402 and step 404 may occur simultaneously.

Figure 5:
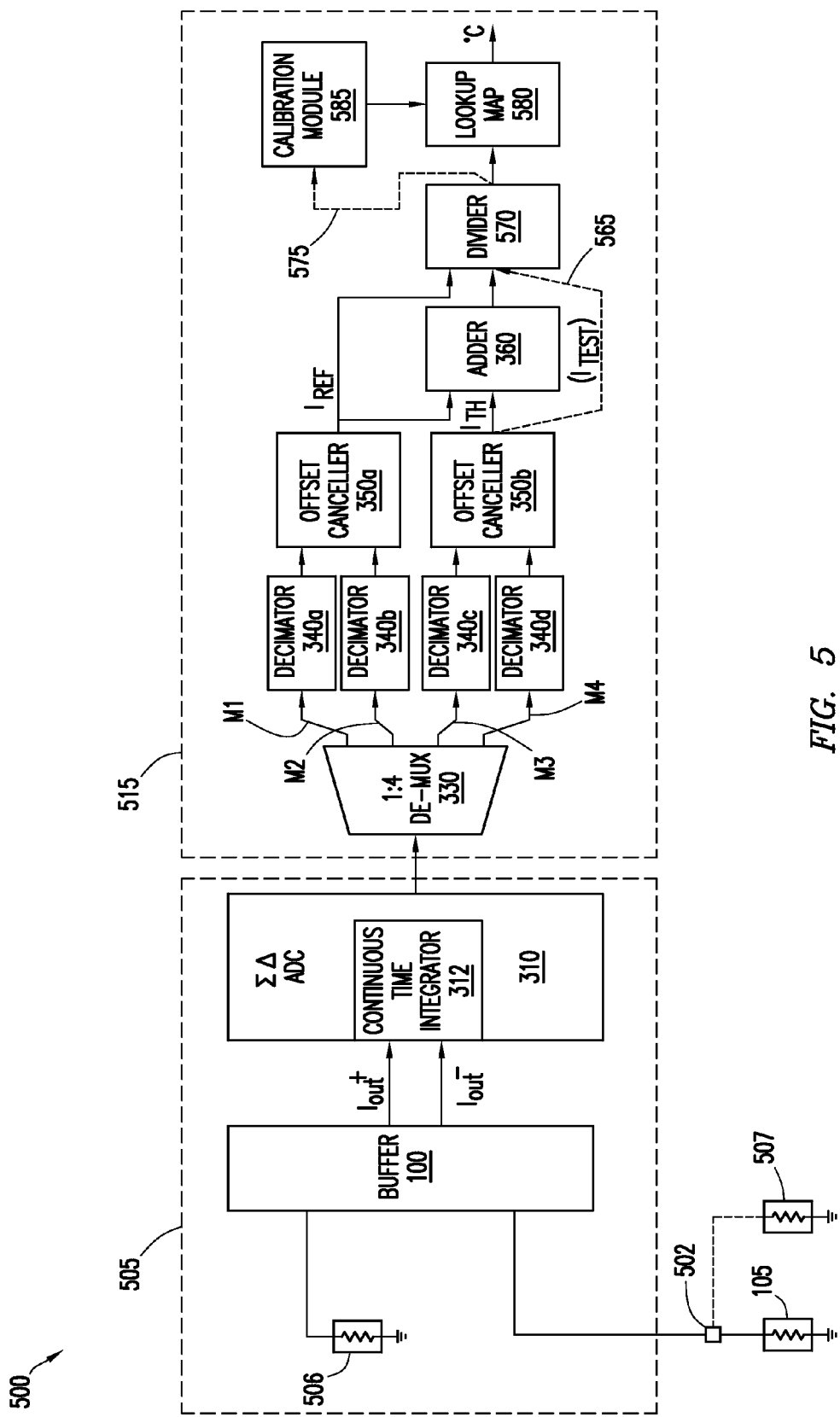
FIG. 5 illustrates a block diagram depicting a calibrated temperature measurement system, in accordance with the teachings of the present disclosure.

FIG. 5 illustrates a block diagram depicting a calibrated temperature measurement system 500, in accordance with the teachings of the present disclosure. Temperature measurement system 500 may include similar components, and may perform similar measurements, as compared to temperature measurement system 300. Temperature measurement system 500 may also include additional components that may provide for the characterization of an on-chip reference resistor (e.g., reference resistor 506), and the calibration of temperature measurements that may use such an on-chip reference resistor.

In some embodiments, reference resistor 506 may be an on-chip resistor located on the same semiconductor chip as analog input stage 505 and digital calculation stage 515. For example, reference resistor may comprise a polysilicon structure located on a semiconductor chip, and may be referred to as a "polysilicon resistor" or as a "poly resistor." The value of poly resistors such as reference resistor 506 may vary from a designed resistance value based on semiconductor process variation. For example, the value of a poly resistor may vary up to plus or minus ten percent due to semiconductor process variation. Such variation may be more or less depending on the parameters of a given semiconductor process.

In order to account for the potential variation of reference resistor 506, temperature measurement system 500 may be configured to characterize reference resistor 506 and then calibrate temperature measurements that may be based in part on reference resistor 506. For example, prior to temperature measurement system 500 being implemented in a final product, the resistance of reference resistor 506 may be compared to the resistance of a highly accurate test resistor 507 in a test environment. In some embodiments, test resistor 507 may be configured to have a resistance equal to the desired resistance of reference resistor 506. As described in further detail below, a characterization of the resistance of reference resistor 506 as compared to the resistance of test resistor 507 (e.g., the ideal resistance for reference resistor 506) may be stored in calibration module 585. The characterization of reference resistor 506 may then be used to adjust any temperature measurements that may be performed based on reference resistor 506 and thermistor 105 in a final product incorporating temperature measurement system 500.

Temperature measurement system 500 may include analog input stage 505. Like analog input stage 305, analog input stage 505 may include buffer 100 and ADC 310. Because reference resistor 506 may be an on-chip device within analog input stage 505, reference resistor 506 may be coupled directly to the internal multiplexors of buffer 100 without the use of a pin. During temperature measurements, thermistor 105 may be coupled to pin 502. But, during a characterization of reference resistor 506, test resistor 507 may be coupled to pin 502 instead of thermistor 105. The coupling of test resistor 507 to pin 502 may occur, for example, in a test environment prior to temperature measurement system 500 being incorporated in a product with thermistor 105.

With test resistor 507 coupled to pin 502, analog input stage 505 may perform a series of measurements in a similar manner as described above for analog input stage 305. Moreover, DEMUX 330, decimators 340a-d, and offset cancellers 350a-b may convert those measurements into multi-bit values, $I_{REF}$ and $I_{TEST}$, in a similar manner as described above for digital calculation stage 315.

For example, each of the four decimators 340a-d may be configured to receive the stream of digital bits from ADC 310 during one of four measurements (e.g., measurements M1 through M4). DEMUX 330 may route measurement M1 to decimator 340a, measurement M2 to decimator 340b, measurement M3 to decimator 340c, and measurement M4 to decimator 340d. Measurements M1 and M2 may include opposing measurements of reference resistor 506. Measurement M1 may include the stream of bits from ADC 310 during a first period of time when reference resistor 506 may be measured with buffer 100 set to a first polarity setting. In addition, measurement M2 may include the stream of bits from ADC 310 during a second period of time when reference resistor 506 may be measured with buffer 100 set to a second polarity setting. Similarly, measurements M3 and M4 may include opposing measurements for test resistor 507. For example, measurement M3 may include the stream of bits from ADC 310 during a third period of time when test resistor 507 may be measured with buffer 100 set to the first polarity setting. In addition, measurement M4 may include the stream of bits from ADC 310 during a fourth period of time when test resistor 507 may be measured with buffer 100 set to the second polarity setting.

Offset canceller 350a may then combine the outputs of decimators 340a and 340b, and may output a multi-bit value, $I_{REF}$, that may correspond to the resistance of reference resistor 506. Likewise, offset canceller 350b may combine the outputs for decimators 340c and 340d, and may output a multi-bit value, $I_{TEST}$, that may correspond to the resistance of test resistor 507. During characterization, the functionality of adder 360 may be bypassed. For example, $I_{TEST}$ may be routed directly to divider 570 via path 565. $I_{REF}$ may also be routed to divider 570. Because $I_{TEST}$ and $I_{REF}$ may be inversely proportional to the respective resistances of test resistor 507 and reference resistor 506, a current ratio such as $I_{TEST}/I_{REF}$ may be equivalent to a resistance ratio such as $R_{REF}/R_{TEST}$.

In some embodiments, test resistor 507 may have a highly accurate resistance that may be approximately equal to the designed ideal resistance of reference resistor 506. Accordingly, divider 570 may calculate a characterization ratio between the actual resistance of reference resistor 506 (e.g., $R_{REF}$) and the ideal resistance for reference resistor 506 (e.g., $R_{TEST}$). Such a characterization ratio may be expressed as $\gamma = R_{REF}/R_{TEST}$. The resistor characterization information may then be stored in a memory. For example, the ratio of $R_{REF}$ divided by $R_{TEST}$ may be stored in calibration module 585. In some embodiments, the data used to calculate the resistance ratio may be stored in calibration module 585 in addition to or in place of the characterization ratio. In such embodiments, the stored characterization information may used at a later time (e.g., during a temperature measurement) to calculate the characterization ratio. Calibration module 585 may include any type of non-volatile memory. For example, calibration module 585 may include a plurality of digital fuses that may be physically burned in. In some embodiments, calibration module 585 may include a plurality of EEPROM bits which may be electronically programmed. Accordingly, the ratio of $R_{REF}$ divided by $R_{TEST}$ may be provided to look-up map 580 during subsequent temperature measurements.

After the performance of a characterization, test resistor 507 may be de-coupled from pin 502, and thermistor 105 may be coupled to pin 502. Temperature measurement system 500 may then perform measurements of reference resistor 506 and thermistor 105 in a similar manner as described above with reference to FIG. 3 for thermistor 105 and reference resistor 106. For example, analog input stage 505 may perform two measurements with opposing polarities of buffer 100 for reference resistor 506, and two measurements with opposing polarities of buffer 100 for thermistor 105. DEMUX 330, decimators 340a-d, and offset cancellers 350a-b may then convert those measurements into a multi-bit digital value corresponding to the resistance of thermistor 105 (e.g., $I_{TH}$), and a multi-bit digital value corresponding to the resistance of reference resistor 506 (e.g., $I_{REF}$). Similar to the description above with reference to equations eight and nine, adder 360 and divider 370 may then combine to calculate a resistance ratio that may be represented by the formula:

$$\Gamma_{actual} = R_{REF}/(R_{REF} + R_{TH}) \quad \text{(Eq. Ten)}$$

where $\Gamma_{actual}$ may be the calculated actual resistance ratio, $R_{REF}$ may represent the actual resistance of reference resistor 506, and $R_{TH}$ may represent the resistance of thermistor 105. The actual resistance ratio, $\Gamma_{actual}$, may then be provided to look-up map 580.

Figure 6:
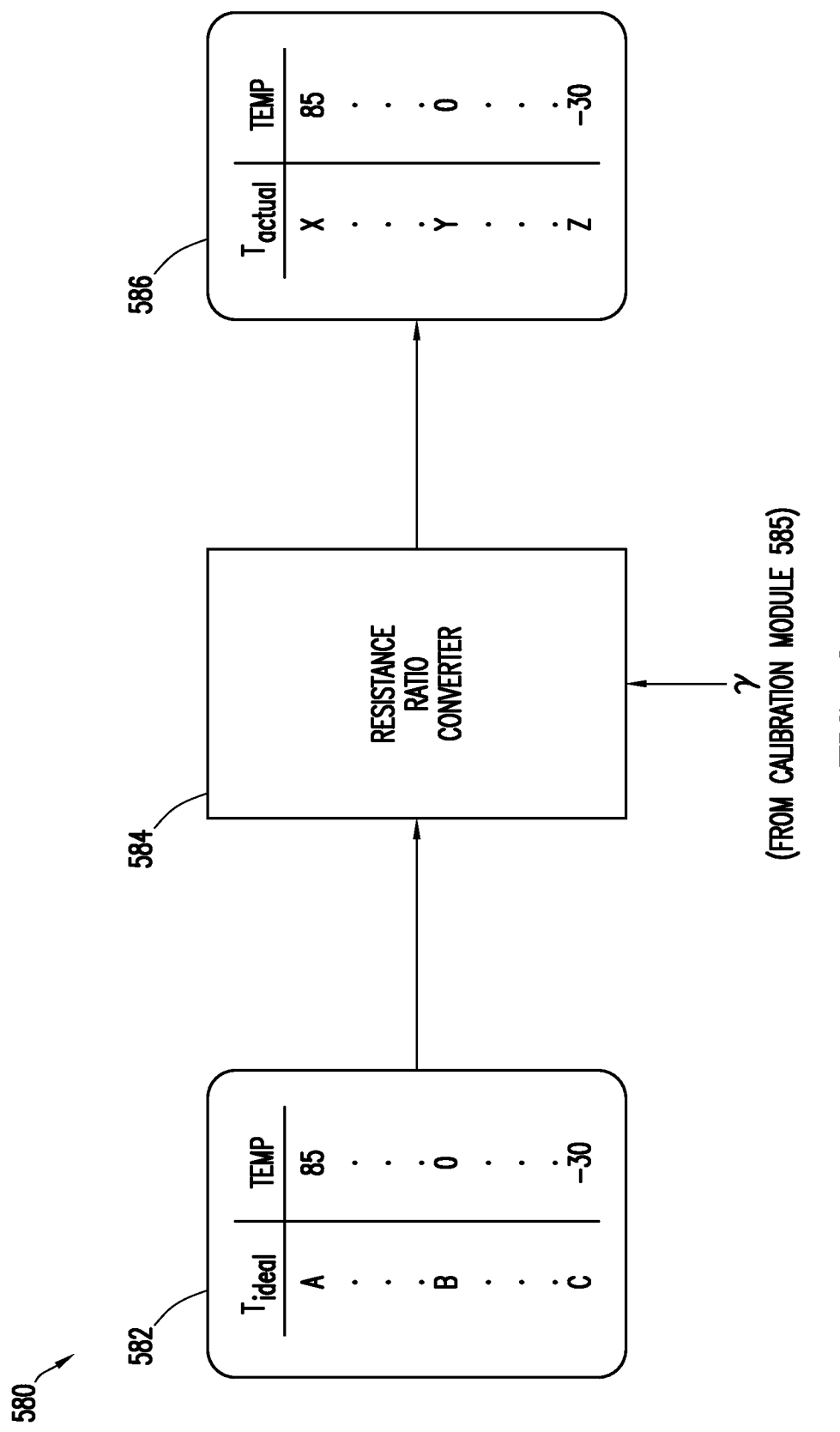
FIG. 6 illustrates a block diagram of a look-up map, in accordance with the teachings of the present disclosure.

FIG. 6 illustrates a block diagram of look-up map 580, in accordance with the teachings of the present disclosure. Similar to look-up map 380, look-up map 580 may include a table 582 which may include resistance-ratio entries and corresponding temperature values that may be based on known characteristics of thermistor 105. The resistance-ratio entries and the temperature values in table 582 may also be based on the ideal designed resistance of reference resistor 506, which may not account for any process variation that may have varied the actual resistance of reference resistor 506. Accordingly, the resistance-ratio entries in table 582 may be referred to as the ideal resistance ratios ($\Gamma_{ideal}$). Look-up map 580 may also include resistance ratio converter 584 that may be configured to calculate actual resistance ratios ($\Gamma_{actual}$) based on: (i) the ideal resistance ratio ($\Gamma_{ideal}$); and (ii) the resistor-characterization ratio ($\gamma$).

As shown by the following series of equations, $\Gamma_{actual}$ may be determined as a function of $\Gamma_{ideal}$ and $\gamma$.

$$\Gamma_{actual} = R_{REF}/(R_{REF} + R_{TH}); \quad \text{(Eq. Eleven)}$$

Equation eleven may be re-written as:

$$\Gamma_{actual} = 1/(1 + (R_{TH}/R_{REF})); \quad \text{(Eq. Twelve)}$$

Solving for the ratio of the actual resistances, the following may be obtained:

$$R_{TH}/R_{REF} = (1/\Gamma_{actual}) - 1; \quad \text{(Eq. Thirteen)}$$

Because the ideal resistance for $R_{REF}$ may be the resistance of $R_{TEST}$, the ideal resistance ratio may be expressed in a similar manner as equation thirteen as follows:

$$R_{TH}/R_{TEST} = (1/\Gamma_{ideal}) - 1; \quad \text{(Eq. Fourteen)}$$

Multiplying both sides of equation fourteen by $(1/\gamma)$ may result in:

$$R_{TH}/(\gamma^* R_{TEST}) = ((1/\Gamma_{ideal}) - 1)/\gamma; \quad \text{(Eq. Fifteen)}$$

Substituting $R_{REF} = \gamma^* R_{TEST}$ into equation fourteen may result in:

$$R_{TH}/R_{REF} = ((1/\Gamma_{ideal}) - 1)/\gamma; \quad \text{(Eq. Sixteen)}$$

And substituting equation sixteen into equation twelve, the following equation for $\Gamma_{actual}$ as a function of $\Gamma_{ideal}$ and $\gamma$ may be obtained:

$$\Gamma_{actual} = 1/(1 + (((1/\Gamma_{ideal}) - 1)/\gamma)). \quad \text{(Eq. Seventeen)}$$

In some embodiments, resistance ratio converter 584 may calculate a value of $\Gamma_{actual}$ for every entry in table 582. Accordingly, calibrated table 586 may include an $\Gamma_{actual}$ value and a corresponding temperature value for each temperature value that may be contained in table 582. When look-up map 580 receives a resistance ratio from divider 570, look-up map 580 may determine the closest $\Gamma_{actual}$ entry in calibrated table 586, and may return the corresponding temperature output value. The resolution of the temperature measurement may depend on the number of $\Gamma_{actual}$ values in calibrated table 586. For example, calibrated table 586 may include one-hundred and sixteen entries in order to provide a resolution of one-degree Celsius over a range of eighty-five degrees Celsius to negative thirty degrees Celsius.

In some embodiments, look-up map 580 may be configured to interpolate a temperature value based on two or more entries in calibrated table 586. For example, if a resistance-ratio input is half way between two $\Gamma_{actual}$ values in table 586, look-up map 580 may calculate and output a temperature that may be half way between the corresponding temperature values for the two table entries. In some embodiments, look-up map 580 may include an algorithm instead of a table of resistance ratios and corresponding temperature values. For such embodiments, look-up map 380 may calculate a temperature output based on the actual resistance ratio, the resistor-characterization ratio, and known characteristics of thermistor 105.

The characterization of on-chip reference resistor 506 and the calibration of temperature measurements that may be based on reference resistor 506 may allow for any reference-resistor errors to be minimized and for costs to be reduced. For example, the monetary cost of an external reference resistor with a one-percent accuracy rating may be significantly more than the monetary costs of the incremental semiconductor space used to incorporate reference resistor 506 on the same chip as analog input stage 505 and/or digital calculation stage 515. Moreover, calibrating temperature measurements with the characterization information for reference resistor 506 may achieve a higher degree of accuracy (e.g., 0.1%) than possible with, for example, a one-percent off-chip reference resistor. Additionally, the on-chip incorporation of reference resistor 506 may reduce the number of pins required for a given application incorporating a temperature measurement system. Accordingly, the semiconductor packaging costs may be reduced and the complexity of a printed-circuit board layout for an application including temperature measurement system 500 may be simplified.

Figure 7:
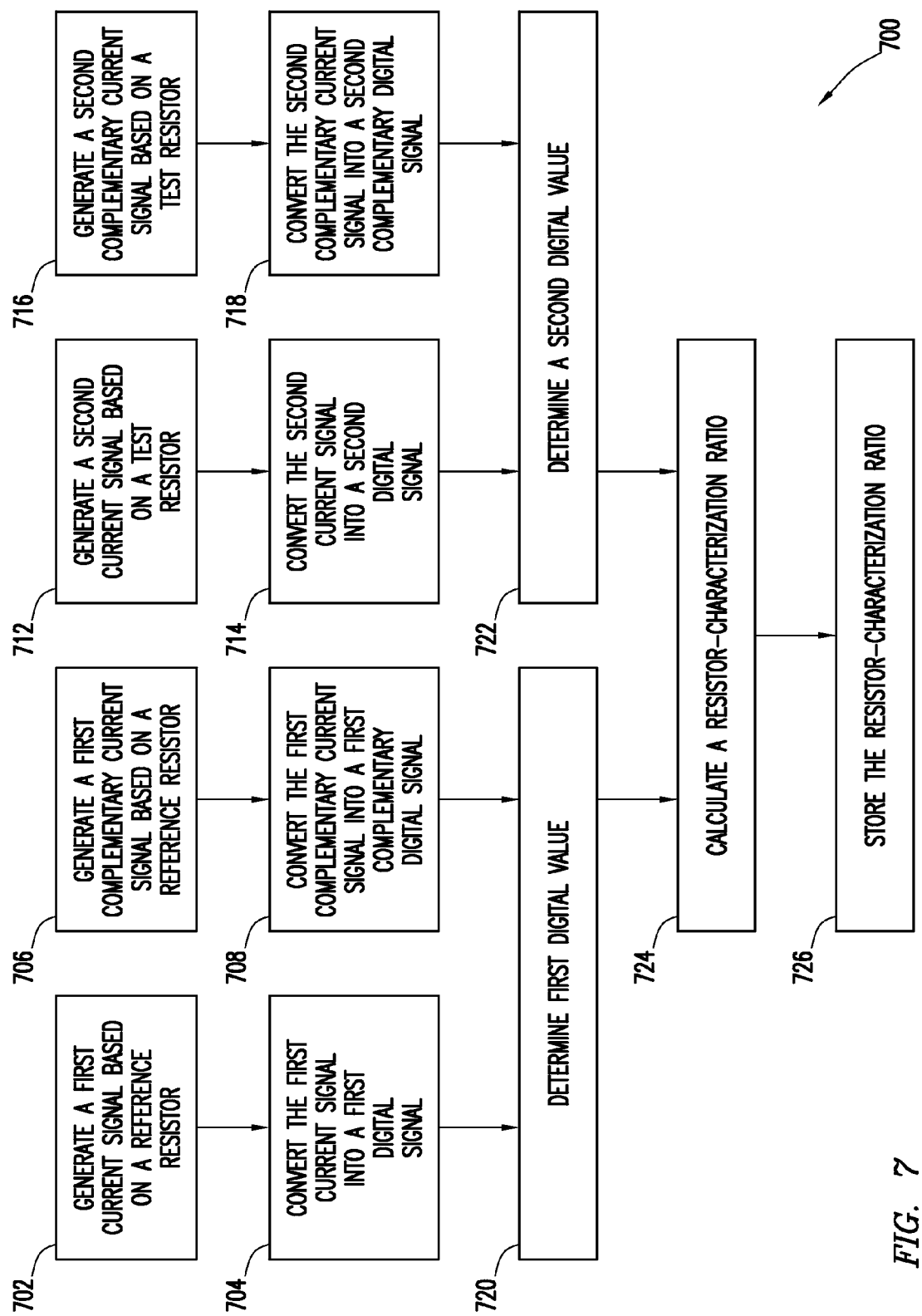
FIG. 7 depicts a flow chart of an example method for calibrating a temperature measurement system, in accordance with the teachings of the present disclosure.

FIG. 7 depicts a flow chart of an example method 700 for calibrating temperature measurement system 500, in accordance with the teachings of the present disclosure.

At step 702, a first current signal based on a resistance of a reference resistor may be generated. For example, buffer 100 may generate a differential output current that may be based on reference resistor 506. In some embodiments, buffer 100 may be in a first polarity state during step 702. At step 704, the first current signal may be converted into a first digital signal. For example, ADC 310 may be a sigma-delta ADC, and may convert the differential output current from buffer 100 into a stream of digital bits.

At step 706, a first complementary current signal based on the resistance of the reference resistor may be generated. For example, the polarity of buffer 100 may be changed from a first polarity state to a second polarity state, and buffer 100 may generate a differential output current that may be based on reference resistor 506. Accordingly, offset current (e.g., $I_{OFF}$) incurred during step 702 may be matched by an equivalent offset during step 706. At step 708, the first complementary current signal may be converted into a first complementary digital signal. For example, ADC 310 may be a sigma-delta ADC, and may convert the differential output current from buffer 100 into a stream of digital bits.

At step 712, a second current signal based on a resistance of a test resistor may be generated. For example, and buffer 100 may generate a differential output current that may be based on test resistor 507. In some embodiments, buffer 100 may be in a first polarity state during step 712. At step 714, the second current signal may be converted into a second digital signal. For example, ADC 310 may be a sigma-delta ADC, and may convert the differential output current from buffer 100 into a stream of digital bits.

At step 716, a second complementary current signal based on the resistance of the test resistor may be generated. For example, the polarity of buffer 100 may be changed from a first polarity state to a second polarity state, and buffer 100 may generate a differential output current that may be based on test resistor 507. Accordingly, offset current (e.g., $I_{OFF}$) incurred during step 712 may be matched by an equivalent offset during step 716. At step 718, the second complementary current signal may be converted into a second complementary digital signal. For example, ADC 310 may be a sigma-delta ADC, and may convert the differential output current from buffer 100 into a stream of digital bits.

At step 720, a first digital value corresponding to the resistance of the reference resistor may be determined. In some embodiments, the first digital value may be based on the first digital signal and the first complementary digital signal. For example, DEMUX 330 may route the first digital signal (e.g., the stream of bits generated by ADC 310 during step 704) to decimator 340a. Similarly, DEMUX 330 may route the first complementary digital signal (e.g., the stream of bits generated by ADC 310 during step 708) to decimator 340b. Decimators 340a and 340b may convert their respectively received digital signals into multi-bit values, and may send those multi-bit values to offset canceller 350a. Offset canceller 350a may subtract the output of decimator 340b from the output of decimator 340a and may output a digital value (e.g., $I_{REF}$) that may correspond to the resistance of reference resistor 506.

At step 722, a second digital value corresponding to the resistance of the test resistor may be determined. In some embodiments, the second digital value may be based on the second digital signal and the second complementary digital signal. For example, DEMUX 330 may route the second digital signal (e.g., the stream of bits generated by ADC 310 during step 714) to decimator 340c. Similarly, DEMUX 330 may route the second complementary digital signal (e.g., the stream of bits generated by ADC 310 during step 718) to decimator 340d. Decimators 340c and 340d may convert their respectively received digital signals into multi-bit values, and may send those multi-bit values to offset canceller 350b. Offset canceller 350b may subtract the output of decimator 340d from the output of decimator 340c and output a digital value and may output a digital value (e.g., $I_{TEST}$) that may correspond to the resistance of test resistor 507.

At step 724, a resistor-characterization ratio may be calculated based on the first digital value and the second digital value. For example, divider 370 may divide the second digital value (e.g., $I_{TEST}$) by the first digital value (e.g., $I_{REF}$) to get a value that may be equivalent to a ratio of the resistance of reference resistor 506 divided test resistor 507 (e.g., $R_{REF}/R_{TEST}$). Similar to the description above with reference to equation seven, dividing one digital value (e.g., $I_{TEST}$) by another digital value (e.g., $I_{REF}$) may cancel the voltage offset of amplifier 120 in buffer 100. At step 726, the resistor-characterization ratio may be stored in a memory. In some embodiments, the memory may be a non-volatile memory, and the stored resistor-characterization ratio may be available to temperature measurement system 500 during later performed temperature measurements.

Although FIG. 7 discloses a particular number of steps to be taken with respect to method 700, method 700 may be executed with greater or lesser steps than those depicted in FIG. 7. For example, method 700 may be executed without steps 706, 708, 716, and 718. In addition, although FIG. 7 discloses a certain order of steps to be taken with respect to method 700, the steps included in method 700 may be completed in any suitable order. For example, step 702 and step 704 may occur simultaneously.

Figure 8:
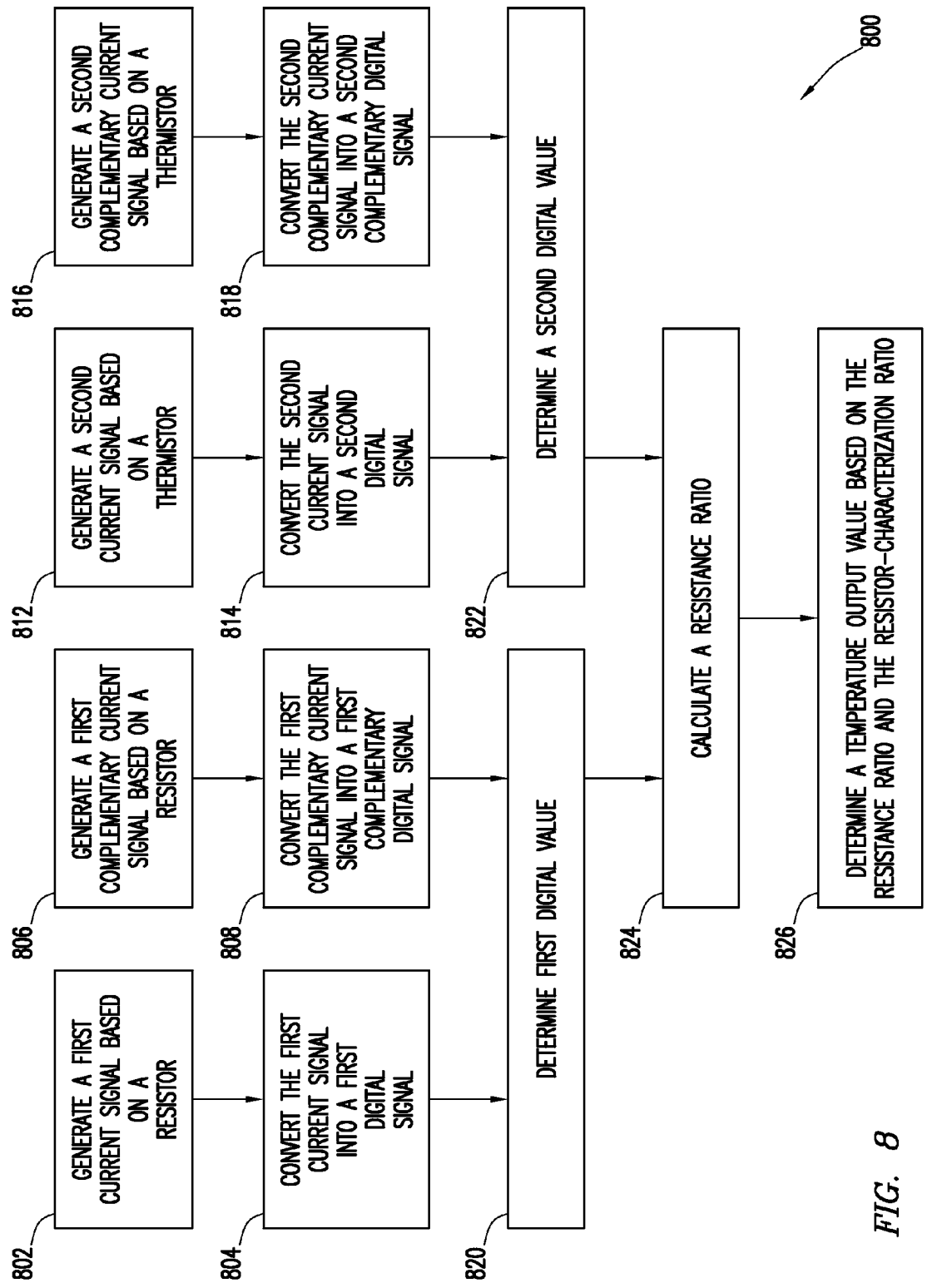
FIG. 8 depicts a flow chart of an example method for measuring temperature, in accordance with the teachings of the present disclosure.

FIG. 8 depicts a flow chart of an example method 800 for measuring temperature, in accordance with the teachings of the present disclosure.

At step 802, a first current signal based on a resistance of a resistor may be generated. For example, buffer 100 may generate a differential output current that may be based on reference resistor 506. In some embodiments, buffer 100 may be in a first polarity state during step 802. At step 804, the first current signal may be converted into a first digital signal. For example, ADC 310 may be a sigma-delta ADC, and may convert the differential output current from buffer 100 into a stream of digital bits.

At step 806, a first complementary current signal based on the resistance of the resistor may be generated. For example, the polarity of buffer 100 may be changed from a first polarity state to a second polarity state, and buffer 100 may generate a differential output current that may be based on reference resistor 506. Accordingly, current offset (e.g., $I_{OFF}$) incurred during step 802 may be matched by an equivalent offset during step 806. At step 808, the first complementary current signal may be converted into a first complementary digital signal. For example, ADC 310 may be a sigma-delta ADC, and may convert the differential output current from buffer 100 into a stream of digital bits At step 812, a second current signal based on a resistance of a thermistor may be generated. For example, buffer 100 may generate a differential output current that may be based on thermistor 105. In some embodiments, buffer 100 may be in a first polarity state during step 812. At step 814, the second current signal may be converted into a second digital signal. For example, ADC 310 may be a sigma-delta ADC, and may convert the differential output current from buffer 100 into a stream of digital bits.

At step 816, a second complementary current signal based on the resistance of the thermistor may be generated. For example, the polarity of buffer 100 may be changed from a first polarity state to a second polarity state, and buffer 100 may generate a differential output current that may be based on thermistor 105. Accordingly, offset current (e.g., $I_{OFF}$) incurred during step 812 may be matched by and equivalent offset during step 816. At step 818, the second complementary current signal may be converted into a second complementary digital signal. For example, ADC 310 may be a sigma-delta ADC, and may convert the differential output current from buffer 100 into a stream of digital bits.

At step 820, a first digital value corresponding to the resistance of the reference resistor may be determined. In some embodiments, the first digital value may be based on the first digital signal and the first complementary digital signal. For example, DEMUX 330 may route the first digital signal (e.g., the stream of bits generated by ADC 310 during step 804) to decimator 340a. Similarly, DEMUX 330 may route the first complementary digital signal (e.g., the stream of bits generated by ADC 310 during step 808) to decimator 340b. Decimators 340a and 340b may convert their respectively received digital signals into multi-bit values, and may send those multi-bit values to offset canceller 350a. Offset canceller 350a may subtract the output of decimator 340b from the output of decimator 340a and output a digital value (e.g., $I_{REF}$) that may correspond to the resistance of reference resistor 506.

At step 822, a second digital value corresponding to the resistance of the thermistor may be determined. In some embodiments, the second digital value may be based on the second digital signal and the second complementary digital signal. For example, DEMUX 330 may route the second digital signal (e.g., the stream of bits generated by ADC 310 during step 814) to decimator 340c. Similarly, DEMUX 330 may route the second complementary digital signal (e.g., the stream of bits generated by ADC 310 during step 818) to decimator 340d. Decimators 340c and 340d may convert their respectively received digital signals into multi-bit values, and may send those multi-bit values to offset canceller 350b. Offset canceller 350b may subtract the output of decimator 340d from the output of decimator 340c and output a digital value (e.g., $I_{TH}$) that corresponds to the resistance of thermistor 105.

At step 824, a resistance ratio may be calculated based on the first digital value and the second digital value. For example, adder 360 and divider 370 may combine to divide the first digital value (e.g., $I_{REF}$) by the sum of the first digital value (e.g., $I_{REF}$) and the second digital value (e.g., $I_{TH}$). As described above with reference to equation seven, dividing the first digital value (e.g., $I_{REF}$) by the sum of the first digital value (e.g., $I_{REF}$) and the second digital value (e.g., $I_{TH}$) may cancel the voltage offset of amplifier 120 in buffer 100. Further, as shown above with reference to equations eight and nine, such a ratio of current values may be equivalent to a resistance ratio including the resistance of reference resistor 506 and thermistor 105. At step 826, a temperature output value may be determined based on the resistance ratio and the resistor-characterization ratio.

Although FIG. 8 discloses a particular number of steps to be taken with respect to method 800, method 800 may be executed with greater or lesser steps than those depicted in FIG. 8. For example, method 800 may be executed without steps 806, 808, 816, and 818. In addition, although FIG. 8 discloses a certain order of steps to be taken with respect to method 800, the steps included in method 800 may be completed in any suitable order. For example, step 802 and step 804 may occur simultaneously.

Figure 9:
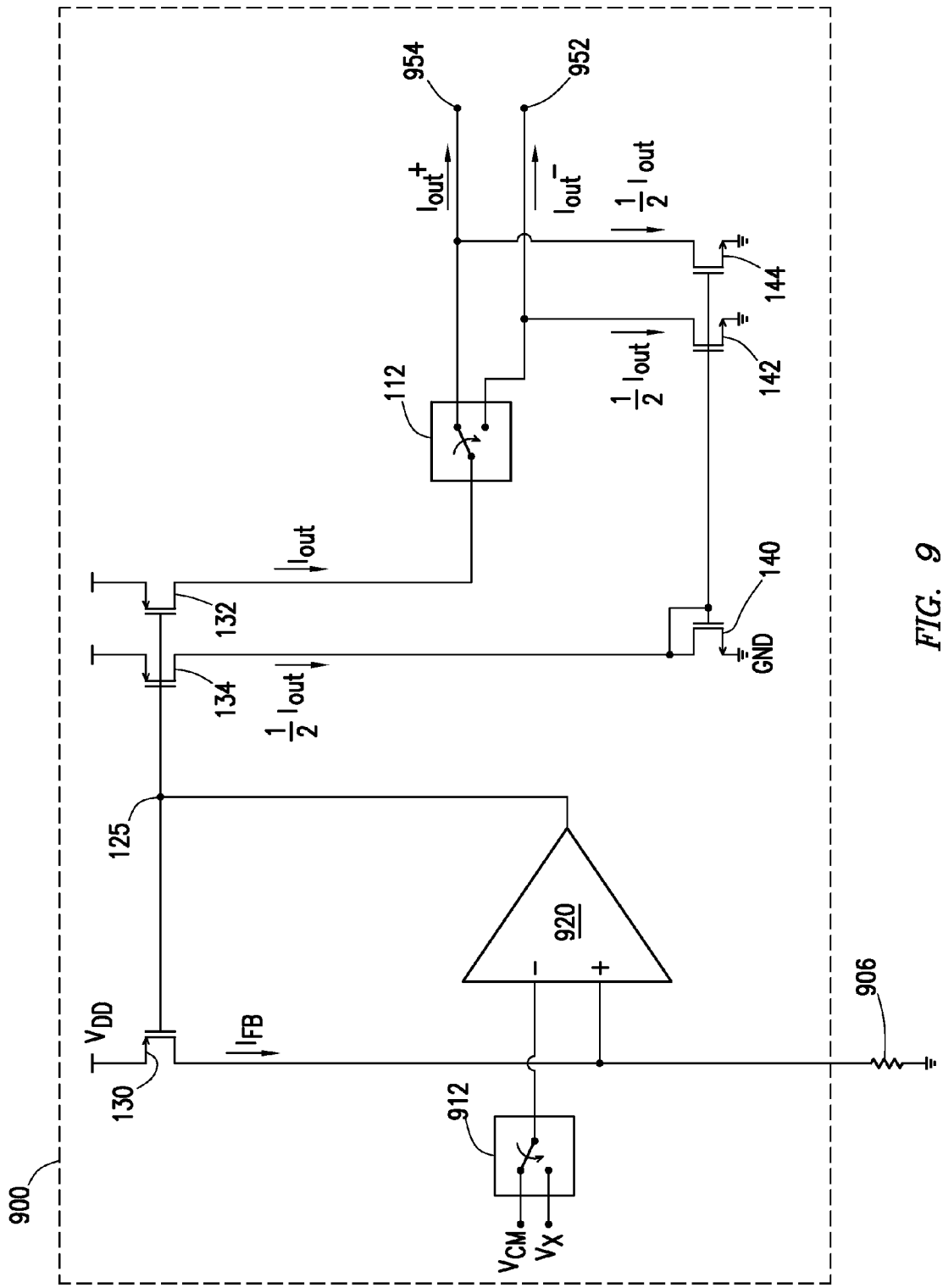
FIG. 9 illustrates a schematic diagram of a current-mode buffer, in accordance with the teachings of the present disclosure.

FIG. 9 illustrates a schematic diagram of a current-mode buffer 900, in accordance with the teachings of the present disclosure. Buffer 900 may be an input stage for a system that, as described in greater detail below with reference to FIG. 11, may be configured to measure voltage.

Buffer 900 may include a common-mode voltage reference ($V_{CM}$), an amplifier 920, PMOS transistors 130, 132, 134, NMOS transistors 140, 142, 144, as well as switch 112 and switch 912. Buffer 100 may be configured to sense a voltage, and to output a current that may be based on the sensed voltage. In some embodiments, the output current may be proportional to the sensed voltage.

In some embodiments, amplifier 920 may have a negative input coupled to one out of a plurality of voltage inputs. For example, the negative input of amplifier 920 may be coupled to one out of $V_{CM}$ and $V_X$ via switch 912. In a first state, switch 912 may couple $V_{CM}$ to amplifier 920, and in a second state, switch 912 may coupled $V_X$ to amplifier 920. The output of amplifier 920 may be coupled to feedback node 125, which may drive the gate of PMOS 130. PMOS 130 may in turn provide a feedback current ($I_{FB}$) to resistor 906, which may be coupled to a positive input of amplifier 920. In some embodiments, resistor 906 may be an off-chip device, and in some embodiments, resistor 906 may be on on-chip device located on the same semiconductor chip as buffer 900. The feedback loop formed by PMOS 130 may drive a feedback current sufficient to force the voltage at the positive input to be equivalent to the voltage coupled to the negative input of amplifier 920. Accordingly, when the $V_{CM}$ is coupled to the negative input of amplifier 920, the feedback current may be expressed as $I_{FB}=V_{CM}/R_{906}$, where $R_{906}$ may be the resistance of resistor 906. Likewise, when the $V_X$ is coupled to the negative input of amplifier 920, the feedback current may be expressed as $I_{FB}=V_X/R_{906}$.

In some embodiments, buffer 900 may be configured to generate an output current in a similar manner as described above with reference to FIG. 1A for buffer 100. For example, PMOS 132 may be configured to mirror PMOS 130 at any suitable ratio, and thus may generate a single-ended output current, $I_{OUT}$, that may be proportional to $I_{FB}$. In some embodiments, PMOS 130 may be coupled to switch 112, which may route $I_{OUT}$ to one of two output nodes. For example, when switch 112 is in a first state, switch 112 may route $I_{OUT}$ to positive output node 954. When switch 112 is in a second state, switch 112 may route $I_{OUT}$ to negative output node 952.

In some embodiments, buffer 900 may be configured to convert the single-ended output current $I_{OUT}$ into a differential output current by sinking a current of one-half $I_{OUT}$ from both the positive output node 954 and the negative output node 952. For example, PMOS 134 may be configured to mirror PMOS 130, but at one-half the ratio with which PMOS 132 may mirror PMOS 130. Accordingly, PMOS 132 may generate a single-ended current equivalent to one-half $I_{OUT}$. NMOS 140 may be configured to accept the one-half $I_{OUT}$ current. NMOS 140 may be self-biased (i.e., have a gate coupled to its drain) and may generate a gate bias for NMOS 142 and NMOS 144. NMOS 142 and NMOS 144 may have a gate coupled to the gate of NMOS 140 and may be configured to have the same size as NMOS 140. Accordingly, NMOS 142 and NMOS 144 may each be configured to mirror the one-half $I_{OUT}$ current of NMOS 140. In some embodiments, NMOS 142 may have a drain coupled to negative output node 952 and NMOS 144 may have a drain coupled to positive output node 154. Accordingly, NMOS 142 may sink a current of approximately one-half $I_{OUT}$ from negative output node 952, and NMOS 144 may sink a current of approximately one-half $I_{OUT}$ from positive output node 954.

In addition to alternating the output polarity of buffer 900 by alternating the state of switch 112, buffer 900 may be configured to alternate the input polarity by alternating the input polarity state of amplifier 920. The alternating polarity states of amplifier 920 are described in further detail below with reference to FIG. 10.

Figure 10:
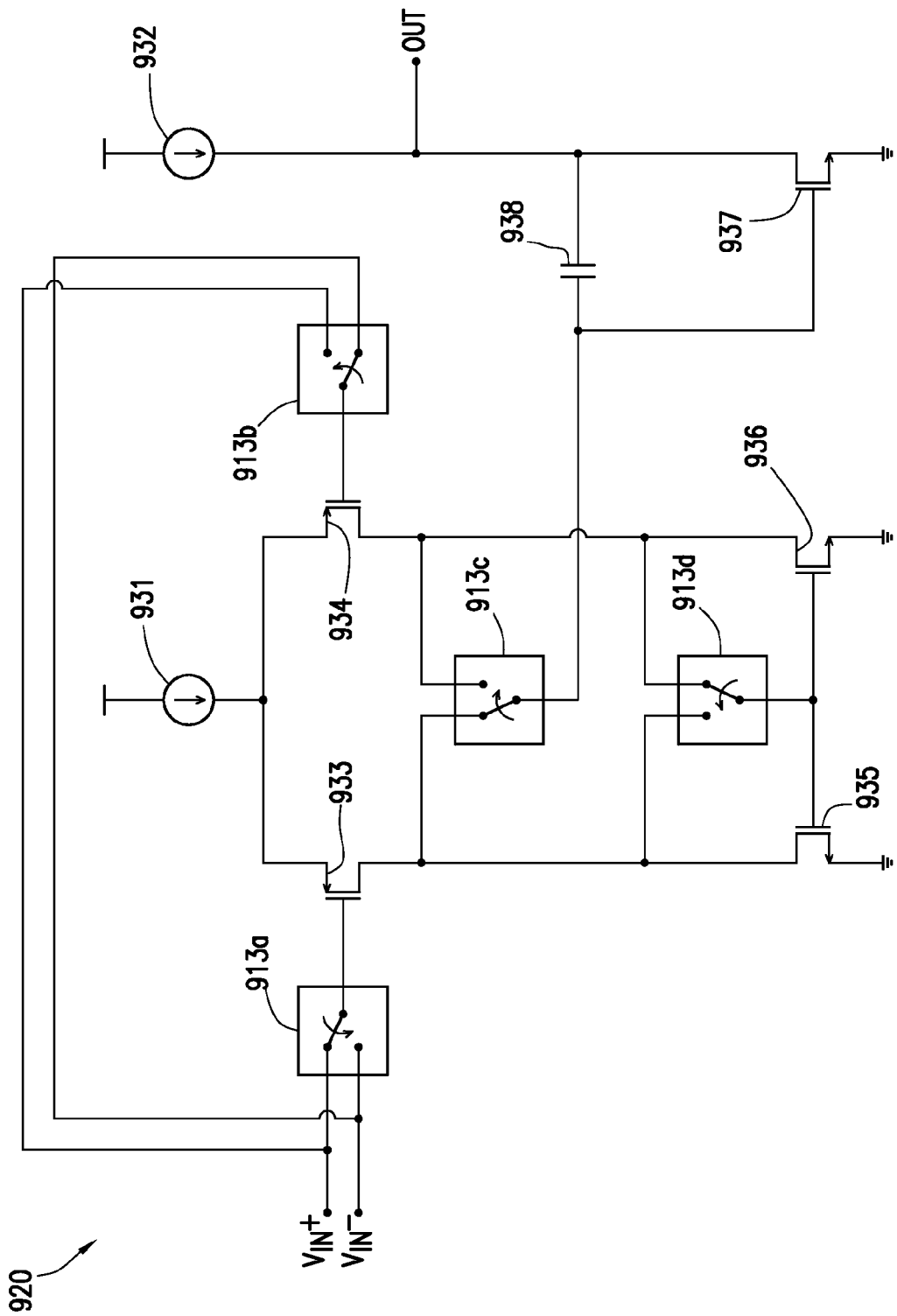
FIG. 10 illustrates a schematic diagram of an amplifier, in accordance with the teachings of the present disclosure.

FIG. 10 illustrates a schematic diagram of amplifier 920, in accordance with the teachings of the present disclosure. Amplifier 920 may include a positive input ($V_{IN}^+$), a negative input ($V_{IN}^-$), current sources 931 and 932, switches 913a-d, a differential pair formed by PMOS 933 and PMOS 934, a pair of matched transistors formed by NMOS 935 and NMOS 936, and a second-stage formed by NMOS 937 and miller capacitor 938.

In some embodiments, amplifier 920 may be configured to alternate polarity states based on the state of switches 913a-d. For example, PMOS 933 and PMOS 934 may be configured as an input-stage differential pair biased by current source 931. In a first polarity state of amplifier 920, $V_{IN}^+$ may be coupled to the gate of PMOS 933 by switch 913a, and $V_{IN}^-$ may be coupled to the gate of PMOS 934 by switch 913b. The drain of PMOS 933 may be coupled to the drain of NMOS 935. Likewise, the drain of PMOS 934 may be coupled to the drain of NMOS 936. In the first polarity state, switch 913d may couple the drain of NMOS 936 to the gate of NMOS 936 and the gate of NMOS 935, making NMOS 936 a self-biased device that also biases NMOS 935. Accordingly, the output of the first stage may be the node coupling the drain of PMOS 933 and the drain of NMOS 935. In turn, this first stage output node may be coupled by switch 913c to the gate NMOS 937 in the second stage of amplifier 920. The drain of NMOS 937 may be coupled to current source 932 at the output node (OUT) of amplifier 920.

In a second polarity state of amplifier 920, the state of each of the switches 913a-d may be alternated to a second state. For example, $V_{IN}^-$ may be coupled to the gate of PMOS 933 by switch 913a, and $V_{IN}^+$ may be coupled to the gate of PMOS 934 by switch 913b. The drain of PMOS 933 may be coupled to the drain of NMOS 935. Likewise, the drain of PMOS 934 may be coupled to the drain of NMOS 936. In the second polarity state, switch 913d may couple the drain of NMOS 935 to the gate of NMOS 935 and the gate of NMOS 936, making NMOS 935 a self-biased device that also biases NMOS 936. Accordingly, the output of the first stage may be the node coupling the drain of PMOS 934 and the drain of NMOS 936. In turn, this first stage output node may be coupled by switch 913c to NMOS 937 of the second stage of amplifier 920. The drain of NMOS 937 may be coupled to current source 932 at the output node (OUT) of amplifier 920. Miller capacitor 938 may be coupled from the gate of NMOS 937 to the drain of NMOS 937, and may have a value that may determine the unity gain frequency and the phase margin of amplifier 920 in both the first polarity state and the second polarity state.

Referring back to FIG. 9, buffer 900 may operate in one of four potential states at a time. For example, output switch 112 may operate in either a first or second output-switch state. For the purposes of the present disclosure, the alternating of output switch 112 may be referred to herein as alternating the output polarity of buffer 900. In addition, amplifier 920 may operate in either a first or second polarity state. For the purposes of the present disclosure, alternating the polarity state of amplifier 920 may be referred to herein as alternating the input polarity of buffer 900. With two input polarity states and two output polarity states, buffer 900 may operate in one of four potential states. Moreover, output switch 912 may couple either $V_{CM}$ or $V_X$ to the negative input of amplifier 920. Accordingly, buffer 900 may operate in one of four states at a time while measuring $V_{CM}$, and one of four states at a time while measuring $V_X$, for a combined total of eight unique current-mode measurements. The use of those eight measurements to (i) cancel any offsets incurred in buffer 900 or incurred downstream from buffer 900; and (ii) calculate a value of $V_X$ based on a known value for $V_{CM}$, is described in further detail below with reference to FIG. 11.

Figure 11:
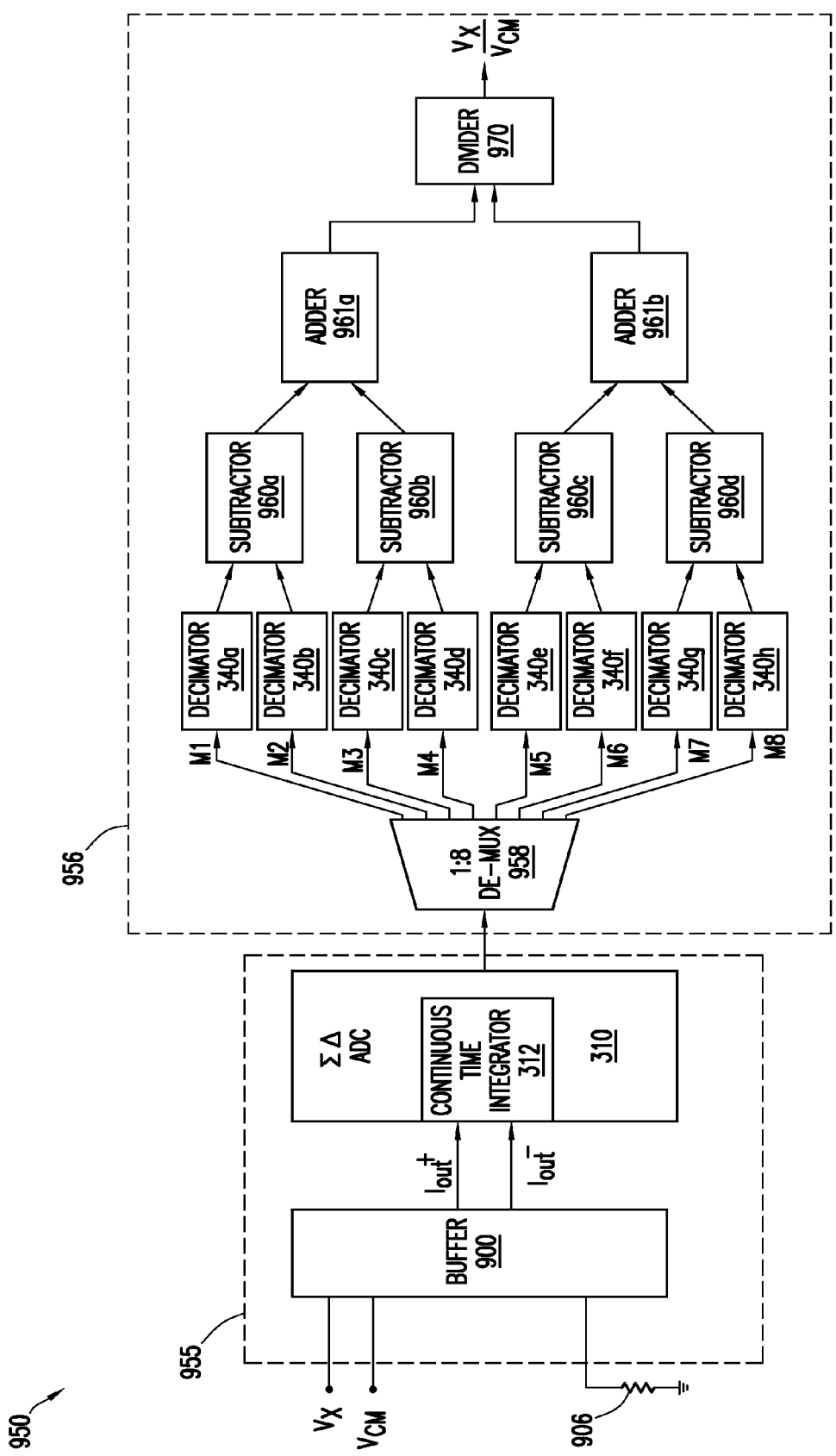
FIG. 11 illustrates a block diagram depicting a voltage measurement system, in accordance with the teachings of the present disclosure.

FIG. 11 illustrates a block diagram depicting voltage-measurement system 950, in accordance with the teachings of the present disclosure. Voltage-measurement system 950 may include analog input stage 955 and digital calculation stage 956. In some embodiments, analog input stage 955 and digital calculation stage 956 may be included on a single semiconductor chip. In some embodiments, resistor 906 of analog input stage 955 may be included on the same semiconductor chip as other portions of analog input stage 955, and in some embodiments, resistor 906 may be an external component.

Analog input stage 955 may include buffer 900 and ADC 310. As described above buffer 900 may be configured to output a differential current signal that may be proportional a selected one of $V_X$ and $V_{CM}$. Moreover, as described above, buffer 900 may alternate between two input polarity states and two output polarity states. For example, buffer 900 may perform four measurements of $V_X$ at time periods one through four, and four measurements of $V_{CM}$ at time periods five through eight. In turn, ADC 310 may convert each of the eight differential current signals from buffer 900 into eight respective streams of digital bits. The output of ADC 310 may in turn be communicated to digital calculation stage 956.

Digital calculation stage 956 may include digital logic configured to receive and process one or more streams of digital bits from ADC 310 and to calculate a voltage and/or a voltage ratio. Digital calculation stage 956 may include DEMUX 958, decimators 340a-h, subtractors 960a-d, adders 961a-b, and divider 970. Digital calculation stage 956 may include logic implemented in any suitable manner. For example, the logic of digital calculation stage 956 may be implemented in an application-specific integrated circuit (ASIC), in a field-programmable gate array (FPGA), in program instructions stored in a memory and configured to be executed by a multi-purpose processor, or any suitable combination thereof.

In some embodiments, the input of digital calculation stage 956 may be coupled to the input of DEMUX 958. DEMUX 958 may be an eight-to-one demultiplexor and may be configured to couple the input of digital calculation stage 956 to one of eight decimators 340 at a time. Eight different measurements for $V_X$ and $V_{CM}$ performed by buffer 900, converted into digital form by ADC 310, and routed to decimators 340a-h, may be represented as described below with reference to equations eighteen through twenty-five.

A first measurement M1 may be routed to decimator 340a. M1 may be based on a current-mode measurement (and subsequent analog-to-digital conversion) of $V_X$ with buffer 900 in a first input polarity state and a first output polarity state. The first measurement M1, may be represented as:

$$M1=((V_X+V_{OFF})/R_{906})+I_{OFF} \quad \text{(Eq. Eighteen)}$$

where $V_{OFF}$ represents the input offset voltage of amplifier 920, $I_{OFF}$ represents the input offset current of ADC 310, and $R_{906}$ represents the resistance of resistor 906.

A second measurement M2 may be routed to decimator 340b. M2 may be based on a current-mode measurement (and subsequent analog-to-digital conversion) of $V_X$ with buffer 900 in a first input polarity state and a second output polarity state. The second measurement M2, may be represented as:

$$M2=(-(V_X+V_{OFF})/R_{906})+I_{OFF}. \quad \text{(Eq. Nineteen)}$$

As shown in equation nineteen, the current value represented by $-(V_X+V_{OFF})/R_{906}$ may be inverted as compared to equation eighteen because, in a second output polarity state, buffer 900 may alternate the polarity of the current that may be routed to the positive and negative output terminals of buffer 900, and thereby may alternate the polarity of the current that may output to ADC 310.

A third measurement M3 may be routed to decimator 340c. M3 may be based on a current-mode measurement (and subsequent analog-to-digital conversion) of $V_X$ with buffer 900 in a second input polarity state and a first output polarity state. The third measurement M3, may be represented as:

$$M3=((V_X-V_{OFF})/R_{906})+I_{OFF}. \quad \text{(Eq. Twenty)}$$

As shown in equation twenty, $V_{OFF}$ may be subtracted from $V_X$ instead of added to $V_X$ because any offset incurred during a first input polarity state (e.g., during measurement M1) may be inverted during a second input polarity state.

A fourth measurement M4 may be routed to decimator 340d. M4 may be based on a current-mode measurement (and subsequent analog-to-digital conversion) of $V_X$ with buffer 900 in a second input polarity state and a second output polarity state. The fourth measurement M4, may be represented as:

$$M4=(-(V_X-V_{OFF})/R_{906})+I_{OFF}. \quad \text{(Eq. Twenty-One)}$$

Measurements five through eight, M5-M8, may be performed on $V_{CM}$ in a similar manner as M1-M4 were performed on $V_X$, and may be routed to decimators 340e-h respectively. Measurements five through eight, may be represented as follows:

$$M5=((V_{CM}+V_{OFF})/R_{906})+I_{OFF}; \quad \text{(Eq. Twenty-Two)}$$

$$M6=(-(V_{CM}+V_{OFF})/R_{906})+I_{OFF}; \quad \text{(Eq. Twenty-Three)}$$

$$M7=((V_{CM}-V_{OFF})/R_{906})+I_{OFF}; \quad \text{(Eq. Twenty-Four)}$$

$$M8=(-(V_{CM}-V_{OFF})/R_{906})+I_{OFF}. \quad \text{(Eq. Twenty-Five)}$$

As described above with reference to FIG. 3, each decimator 340 may convert a stream of digital bits received from ADC 310 into a multi-bit digital value. Subtractors 960a-d, adders 961a-b, and divider 970 may in turn further process the multi-bit digital values output by decimators 340a-h. For example, subtractor 960a may subtract the output of decimator 340b (e.g., a converted M2) from the output of decimator 340a (e.g., a converted M1). Combining equations eighteen and nineteen, the output of subtractor 960a may be represented as:

$$M1-M2=2*(V_X+V_{OFF})/R_{906}. \quad \text{(Eq. Twenty-Six)}$$

As shown in equation twenty-six, $I_{OFF}$ (e.g., the input offset current of ADC 310) in equation eighteen and nineteen may cancel out.

Subtractor 960b may subtract the output of decimator 340d (e.g., a converted M4) from the output of decimator 340c (e.g., a converted M3). Combining equations twenty and twenty-one, the output of subtractor 960b may be represented as:

$$M3-M4=2*(V_X-V_{OFF})/R_{906}. \quad \text{(Eq. Twenty-Seven)}$$

Subtractor 960c may subtract the output of decimator 340f (e.g., a converted M6) from the output of decimator 340e (e.g., a converted M5). Combining equations twenty-two and twenty-three, the output of subtractor 960c may be represented as:

$$M5-M6=2*(V_{CM}+V_{OFF})/R_{906}. \quad \text{(Eq. Twenty-Eight)}$$

Subtractor 960d may subtract the output of decimator 340h (e.g., a converted M8) from the output of decimator 340g (e.g., a converted M7). Combining equations twenty-four and twenty-five, the output of subtractor 960d may be represented as:

$$M7-M8=2*(V_{CM}-V_{OFF})/R_{906}. \quad \text{(Eq. Twenty-Nine)}$$

Adders 961a and 961b may in turn combine the outputs of subtractors 960a-d. For example, adder 961a may add the output of subtractor 960b to the output of subtractor 960a. Combining equations twenty-six and twenty-seven, the output of adder 961a may be represented as:

$$(M1-M2)+(M3-M4)=(4*V_X)/R_{906}. \quad \text{(Eq. Thirty)}$$

As shown in equation twenty-nine, $V_{OFF}$ (e.g., the input offset voltage of amplifier 920) may be cancelled out when combining the outputs of subtractor 960a and subtractor 960b.

Adder 961b may add the output of subtractor 960d to the output of subtractor 960c. Combining equations twenty-eight and twenty-nine, the output of adder 961b may be represented as:

$$(M5-M6)+(M7-M8)=(4*V_{CM})/R_{906}. \quad \text{(Eq. Thirty-One)}$$

As shown in equation thirty-one, $V_{OFF}$ (e.g., the input offset voltage of amplifier 920) may be cancelled for the measurements of $V_{CM}$ in a similar manner as shown in equation thirty for the measurements of $V_X$.

The respective outputs of adders 961a and 961b may be communicated to the inputs of divider 970. Divider 970 may divide one value by the other. For example, divider 970 may divide the output of adder 961a by the output of adder 961b. Combining equations thirty and thirty-one, the output of divider 970 may be represented as:

$$((4*V_X)/R_{906})/((4*V_{CM})/R_{906})=V_X/V_{CM}. \quad \text{(Eq. Thirty-Two)}$$

As shown in equation thirty-two, the multiple of four and the value of resistor 906 may cancel out, and the output of divider 970 may be equivalent to the ratio of $V_X$ divided by $V_{CM}$. Accordingly, the output of divider 970 may be referred to as a voltage ratio.

In some embodiments, the voltage of $V_{CM}$ may be a known value. For example, $V_{CM}$ may be a known value based on a bandgap voltage. Accordingly, the value for $V_X$ may be determined based on the known value of $V_{CM}$ and the calculated voltage ratio $V_X/V_{CM}$. Such a determination may be performed in any suitable manner. In some embodiments, the output of divider 970 may be provided to a look-up map which may include a table of voltage-ratio entries and corresponding output values for $V_X$. In some embodiments, the value of $V_X$ may be determined based on an algorithm rather than a look-up table. For example, the calculated ratio $V_X/V_{CM}$ may be multiplied by a known value of $V_{CM}$ in order to obtain $V_X$.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A temperature measurement system, comprising:
   a resistor;
   a thermistor;
   a resistance-to-current converter configured to generate a current signal based on a resistance of one of the resistor and the thermistor;
   an analog-to-digital converter (ADC) configured to:
      receive a first current signal based on the resistor;
      convert the first current signal into a first digital signal;
      receive a second current signal based on the thermistor; and
      convert the second current signal into a second digital signal;
   a memory comprising resistor-characterization information; and
   a calculation stage communicatively coupled to an ADC output and configured to:
      determine a first digital value based on the first digital signal;
      determine a second digital value based on the second digital signal; and
      determine a temperature output value based on the first digital value, the second digital value, and the resistor-characterization information.

2. The temperature measurement system of claim 1, wherein:
   the ADC is further configured to:
      receive a first complementary current signal based on the resistor;
      convert the first complementary current signal into a first complementary digital signal;
      receive a second complementary current signal based on the thermistor; and
      convert the second complementary current signal into a second complementary digital signal;
   the first digital value is further based on the first complementary digital signal; and
   the second digital value is further based on the second complementary digital signal.

3. The temperature measurement system of claim 1, wherein the resistor is located on the same semiconductor chip as the ADC.

4. The temperature measurement system of claim 1, wherein the resistor-characterization information comprises a resistor-characterization ratio based on an actual resistance of the resistor and a designed resistance of the resistor.

5. The temperature measurement system of claim 1, further comprising:
   a look-up map including a plurality of temperature output values and a corresponding first plurality of resistance-ratio values based on a designed resistance of the resistor; and
   a resistance-ratio converter configured to calculate a second plurality of resistance-ratio values based on the first plurality of resistance-ratio values and the resistor-characterization information.

6. The temperature measurement system of claim 1, wherein the calculation stage is further configured to:
   calculate a ratio based on the first digital value and the second digital value; and
   determine the temperature output value based in part on the ratio.

7. A temperature measurement system, comprising:
   a resistor;
   a resistance-to-current converter configured to generate a current signal based on a resistance of at least the resistor;
   an analog-to-digital converter (ADC) configured to:
      receive a first current signal, the first current signal based on the resistor;
      convert the first current signal into a first digital signal;
      receive a second current signal; and
      convert the second current signal into a second digital signal;
   a memory comprising resistor-characterization information; and
   a calculation stage communicatively coupled to an ADC output and configured to:
      determine a first digital value based on the first digital signal;
      determine a second digital value based on the second digital signal; and
      determine a temperature output value based on the first digital value, the second digital value, and the resistor-characterization information.

8. The temperature measurement system of claim 7, wherein:
   the ADC is further configured to:
      receive a first complementary current signal, the first complementary current signal based on the resistor;
      convert the first complementary current signal into a first complementary digital signal;
      receive a second complementary current signal; and
      convert the second complementary current signal into a second complementary digital signal;
   the first digital value is further based on the first complementary digital signal; and
   the second digital value is further based on the second complementary digital signal.

9. The temperature measurement system of claim 7, wherein the resistor is located on the same semiconductor chip as the ADC.

10. The temperature measurement system of claim 7, wherein the resistor-characterization information comprises a resistor-characterization ratio based on an actual resistance of the resistor and a designed resistance of the resistor.

11. The temperature measurement system of claim 7, further comprising:
- a look-up map including a plurality of temperature output values and a corresponding first plurality of resistance-ratio values based on a designed resistance of the resistor;
- a resistance-ratio converter configured to calculate a second plurality of resistance-ratio values based on the first plurality of resistance-ratio values and the resistor-characterization information.

12. The temperature measurement system of claim 7, wherein the calculation stage is further configured to:
- calculate a ratio based on the first digital value and the second digital value; and
- determine the temperature output value based in part on the ratio.

* * * * *